(12) United States Patent
Cho et al.

(10) Patent No.: US 10,856,425 B2
(45) Date of Patent: Dec. 1, 2020

(54) METHOD FOR MANUFACTURING STRETCHABLE ELECTRONIC DEVICE

(71) Applicant: Hyunmin Cho, Seoul (KR)

(72) Inventors: Hyunmin Cho, Seoul (KR); Sunmin An, Seoul (KR)

(73) Assignee: Hyunmin Cho, Seoul (KR)

( * ) Notice: Subject to any disclaimer, the term of this patent is extended or adjusted under 35 U.S.C. 154(b) by 0 days.

(21) Appl. No.: 16/735,065

(22) Filed: Jan. 6, 2020

(65) Prior Publication Data

US 2020/0146159 A1    May 7, 2020

Related U.S. Application Data

(62) Division of application No. 16/455,064, filed on Jun. 27, 2019, now Pat. No. 10,721,824.

(30) Foreign Application Priority Data

Jun. 28, 2018 (KR) .......................... 10-2018-0074662

(51) Int. Cl.
| | |
|---|---|
| *H05K 3/30* | (2006.01) |
| *H05K 3/46* | (2006.01) |
| *H05K 1/03* | (2006.01) |
| *H05K 3/32* | (2006.01) |
| *H05K 1/18* | (2006.01) |

(52) U.S. Cl.
CPC ......... *H05K 3/4691* (2013.01); *H05K 1/0306* (2013.01); *H05K 1/181* (2013.01); *H05K 3/321* (2013.01); *H05K 2201/0323* (2013.01); *H05K 2201/0373* (2013.01)

(58) Field of Classification Search
CPC ..... H05K 1/0306; H05K 3/321; H05K 3/4691
See application file for complete search history.

(56) References Cited

U.S. PATENT DOCUMENTS

| | | | |
|---|---|---|---|
| 9,269,588 B2* | 2/2016 | Xu .................... | H01L 29/0657 |
| 2008/0257586 A1* | 10/2008 | Chen ................... | H05K 1/0283 |
| | | | 174/254 |
| 2014/0299362 A1* | 10/2014 | Park .................... | H05K 1/0283 |
| | | | 174/254 |
| 2016/0270223 A1* | 9/2016 | Cherenack .......... | H05K 1/0283 |
| 2017/0094774 A1* | 3/2017 | Elsherbini ............. | H05K 1/115 |

FOREIGN PATENT DOCUMENTS

| | | |
|---|---|---|
| KR | 10-1208032 B1 | 12/2012 |
| KR | 10-2017-0060438 A | 6/2017 |

* cited by examiner

*Primary Examiner* — Paul D Kim
(74) *Attorney, Agent, or Firm* — Paratus Law Group, PLLC

(57) ABSTRACT

A method for manufacturing a stretchable electronic device, which includes manufacturing and connecting a stretchable board and a stretchable conductive connecting body constituting the stretchable electronic device; and attaching one or more electric parts to the stretchable conductive connecting body. The stretchable board has a surface for mounting one or more electric parts. The stretchable conductive connecting body is provided on the stretchable board, extended in a three-dimensional stereoscopic structure in a direction away from the surface, and has stretchability. The stretchable conductive connecting body includes a conductive connecting part for attaching an upper surface of the stretchable conductive connecting body to the electric part so as to be electrically connected to an electrode of the electric part.

4 Claims, 42 Drawing Sheets

(a)

(b)

(c)

(a)

(b)

(c)

(a)

(b)

(c)

//<br>
METHOD FOR MANUFACTURING STRETCHABLE ELECTRONIC DEVICE

CROSS-REFERENCE TO RELATED APPLICATION

This application is a Divisional of U.S. patent application Ser. No. 16/455,064, filed on Jun. 27, 2019, now U.S. Pat. No. 10,721,824, which claims priority to Korean Patent Application No. 10-2018-0074662, filed on Jun. 28, 2018, which are all incorporated herein by reference in their entirety.

BACKGROUND

The present disclosure relates to a stretchable conductive connection-based stretchable electronic device and a method for manufacturing the same, and more particularly, to a stretchable conductive connection-based stretchable electronic device and a method for manufacturing the same, which minimizes stress/strain applied to an electric part.

Recently, interest in a wearable electronic device is increasing. The wearable electronic device may occur a problem that the performance of a high-performance Integrated Circuit chip is deteriorated due to the strain and stress such as tensile, compression, or bending.

A conventional IC chip is connected by solder on the two-dimensional plane of a rigid Printed Circuit Board (PCB), and susceptible to external mechanical strain because the electrical contact portion and the PCB itself are not flexible/stretchable.

The wearable electronic device may be unstable in an electrical contact state between the IC chip and the PCB due to the repeated physical strain and stress, thereby remarkably deteriorating the performance, and easily causing a failure due to breakdown of the electrical contact portion. In addition, generally, since the IC chip is connected to the PCB by soldering an electrode material, it is difficult to replace or upgrade various performances of IC chips on the PCB.

SUMMARY

An object of the present disclosure is to provide a stretchable conductive connection-based stretchable electronic device and a method for manufacturing the same, which may minimize the stress/strain applied to the electric part by a stretchable conductive connecting body of a 3D stereoscopic structure, and minimize deterioration of the performance of an electric part due to the stress/strain.

In addition, another object of the present disclosure is to provide a stretchable electronic device and a method for manufacturing the same, which may use a gradual change in modulus of elasticity mechanism (e.g., a change in modulus of elasticity in the order of liquid metal, conductive stretchable polymer, ionic conductor, and elastomer), thereby stably securing the electrical contact state between a rigid high-performance of an electric part (e.g., IC chip) and a stretchable board (e.g., stretchable PCB) regardless of the stress/strain.

In addition, still another object of the present disclosure is to provide a stretchable electronic device and a method for manufacturing the same, which may keep a good electrical connection without changing conductivity even under external strain through various 3D stereoscopic structures, and connect a plurality of (multi-channel) electrodes to be used in a high-performance stretchable/flexible wearable electronic device.

In addition, yet another object of the present disclosure is to provide a stretchable electronic device and a method for manufacturing the same, which may detach and attach the electric part from and to the stretchable board through various sizes and shapes of suckers, thereby easily replacing the electric part, and stably secure the electrical connection through a conductive adhesive material or an adhesive material/suction composite structure when the detachment and attachment are not required.

The objects of the present disclosure are not limited to the above-mentioned objects. Other objects not described may be clearly understood by those skilled in the art to which the present disclosure pertains from the following description.

A stretchable electronic device of the present disclosure includes a stretchable board having a surface for mounting one or more electric parts; and a stretchable conductive connecting body provided on the stretchable board, extended in a three-dimensional stereoscopic structure in the direction away from the surface, and having stretchability, and the stretchable conductive connecting body includes a conductive connecting part for attaching the upper surface of the stretchable conductive connecting body to the electric part so as to be electrically connected to an electrode of the electric part.

In addition, the conductive connecting part may connect the upper surface of the stretchable conductive connecting body by any one of suction, adhesion, and a composite structure thereof so as to be electrically connected to the electrode of the electric part, the conductive connecting part may include a conductive sucker provided so that the electric part may be detached and attached, and the conductive sucker may include a conductive suction plate, a conductive suction cavity, a conductive minute suction cavity, or a composite structure thereof.

In addition, the conductive connecting part may include a conductive adhesive material for stable electrical connection not requiring the detachment and attachment, or include a composite structure of the conductive adhesive material and the conductive sucker.

In addition, the stretchable conductive connecting body may be provided in a core-shell structure by a stretchable member for surrounding the side surface of a second conductive channel electrically connected with a first conductive channel provided inside the stretchable board, and the second conductive channel may include at least one among conductive nanowire such as metal, Carbon Nano Tube (CNT), graphene, liquid metal (e.g., Eutectic Gallium-Indium (EGaIN)), conductive stretchable polymer, Ionic Conductor, or a compound thereof, as a stretchable conductive material charged within the stretchable member.

In addition, the liquid metal may include a Eutectic Gallium-Indium (EGaIn) material.

In addition, a first conductive channel may be provided inside the stretchable board as a circuit channel of a stretchable electronic device corresponding to the movement of the stretchable board, and the first conductive channel may include at least one among conductive nanowire such as metal, Carbon Nano Tube (CNT), graphene, liquid metal (e.g., Eutectic Gallium-Indium (EGaIn)), conductive stretchable polymer, Ionic Conductor, or a compound thereof, as a stretchable conductive material charged in the stretchable board.

In addition, the conductive connecting part may include at least any one of the conductive sucker and the conductive adhesive material for connecting the upper surface thereof to the electric part, and the conductive connecting part may include a composite structure of any one of a suction cup structure and a suction cap structure prepared on the upper end portion of the second conductive channel.

In addition, the conductive connecting part may be prepared in various structures and materials between the electrode of the electric part and a second conductive channel electrically connected with a first conductive channel provided inside the stretchable board, and may have the lower side contacting the second conductive channel and the upper side contacting the electrode to gradually change modulus of elasticity between the stretchable board and the electric part, thereby minimizing stress and strain. In addition, the stretchable conductive connecting body may be extended in the direction away from the surface of the stretchable board to have a three-dimensional structure.

In addition, the stretchable board may be a stretchable Printed Circuit Board (PCB) having a first conductive channel provided as a circuit channel of an electronic device therein, and the electric part may be an Integrated Circuit (IC) chip.

In addition, the stretchable conductive connecting body may include at least any one structure among a spring structure, a three-dimensional fractal structure, and a three-dimensional spring and fractal composite structure.

In addition, the stretchable conductive connecting body may have a multi-channel structure including a second conductive channel in plural, which is electrically connected to a first conductive channel provided inside the stretchable board, the plurality of second conductive channels may be connected to a plurality of electrodes of the electric part having the multi channels, and the stretchable conductive connecting body may have any one structure of a three-dimensional fractal and a composite structure of a three-dimensional spring and the three-dimensional fractal provided so that the upper side spacing between the plurality of second conductive channels are wider than the lower side spacing therebetween.

In addition, the stretchable conductive connecting body may include the second conductive channel in plural, the plurality of second conductive channels may be connected to the plurality of electrodes of the electric part, the upper side spacing between the plurality of second conductive channels may be provided wider than the lower side spacing therebetween, the stretchable conductive connecting body may further include a stretchable member for surrounding the side surfaces of the plurality of second conductive channels provided in the multi-channel structure, and the stretchable member may have any one structure of the three-dimensional fractal and the composite structure of the three-dimensional spring and the three-dimensional fractal including a lower shell for entirely surrounding the plurality of second conductive channels and a plurality of branch shells branched from the lower shell, and prepared to surround the plurality of second conductive channels, respectively.

In addition, the stretchable board may be provided in plural for each module every electric part so as to have the surface for mounting the electric part, and for the mutual stretchable connection between the plurality of electric parts, the stretchable board may have a connecting body inserting part inserted into one side end portion of the stretchable board adjacent to one side thereof; and a connecting body recessed groove part formed so that the connecting body inserting part of the stretchable board adjacent to the other side thereof is inserted formed thereon, respectively.

In addition, a method for manufacturing a stretchable electronic device of the present disclosure includes manufacturing and connecting a stretchable board and a stretchable conductive connecting body constituting the stretchable electronic device; and attaching one or more electric parts to the stretchable conductive connecting body of the stretchable electronic device.

Herein, the manufacturing and connecting the stretchable conductive connecting body may include manufacturing the stretchable conductive connecting body so as to have at least any one among a spring structure, a three-dimensional fractal structure, and a three-dimensional spring and fractal composite structure.

In addition, the manufacturing and connecting the stretchable board and the stretchable conductive connecting body may include manufacturing the stretchable board and the stretchable conductive connecting body by a 3D printer, and the manufacturing the stretchable board may include injecting a stretchable conductive channel material including at least one among conductive nano wire, Carbon Nano Tube (CNT), graphene, liquid metal (e.g., Eutectic Gallium-Indium (EGaIn)), conductive stretchable polymer, Ionic Conductor, or a compound thereof within the stretchable board.

In addition, the manufacturing the stretchable conductive connecting body may include filling a stretchable conductive channel material including at least one among conductive nano wire, Carbon Nano Tube (CNT), graphene, liquid metal (e.g., Eutectic Gallium-Indium (EGaIn)), conductive stretchable polymer, Ionic Conductor, or a compound thereof within a stretchable member coupled to the surface of the stretchable board; and manufacturing a conductive connecting part, and coupling the conductive connecting part to the upper portion of the stretchable conductive connecting body, and the conductive connecting part may include a conductive sucker or a conductive adhesive material for connecting the upper surface of the stretchable conductive connecting body to the electric part, or include a composite structure of the conductive sucker and the conductive adhesive material.

In addition, the manufacturing the conductive connecting part may further include manufacturing a conductive suction cavity, the manufacturing the conductive suction cavity may include manufacturing a cavity structure necessary for suction, and the manufacturing the conductive suction cavity may include applying polystyrene beads on a glass board; deforming the polystyrene beads by heating the polystyrene beads on the glass board at a softening temperature; forming a stretchable/flexible conductive material so as to cover the polystyrene beads on the glass board; and forming the conductive suction cavity on the stretchable/flexible conductive material by removing the polystyrene beads.

The embodiments of the stretchable conductive connection-based stretchable electronic device and the method for manufacturing the same according to the present disclosure may achieve the following various effects.

Firstly, it is possible to minimize the stress/strain applied to the electric part through the stretchable conductive connecting body of the 3D stereoscopic structure, and to minimize the deterioration of the performance of the electric part due to the stress/strain.

Secondly, it is possible to use the gradual change in modulus of elasticity mechanism (e.g., a change in modulus of elasticity in the order of liquid metal, conductive stretchable polymer, Ionic Conductor, and elastomer), thereby stably securing the electrical contact state between the rigid high-performance electric part (e.g., IC chip) and the stretchable board (e.g., stretchable PCB) regardless of the stress/strain.

Thirdly, it is possible to keep the good electrical connection without changing conductivity even under external strain through various 3D stereoscopic structures, and to connect the plurality of (multi-channel) electrodes to be used in the high-performance stretchable/flexible wearable electronic device.

Fourthly, it is possible to detach and attach the electric part from and to the stretchable board through various sizes and shapes of suckers, thereby easily replacing the electric part, and to stably secure the electrical connection through the adhesive material or the adhesive material/suction composite structure when the detachment and attachment are not required.

The effects of the present disclosure are not limited to the effects described above. The effects not described above will be clearly apparent to those skilled in the art to which the present disclosure pertains from the present specification and the accompanying drawings.

DETAILED DESCRIPTION

Figure 1A:
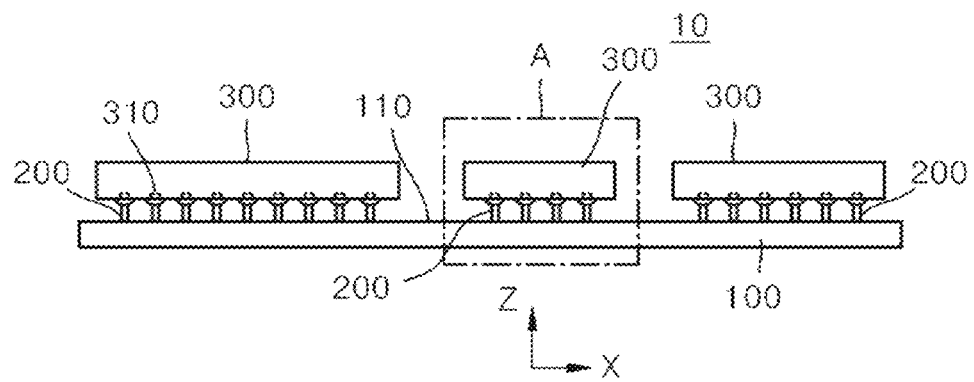
FIG. 1A is a side diagram showing a stretchable electronic device according to an embodiment of the present disclosure.

Other advantages and features of the present disclosure and the method for achieving them will become apparent with reference to the embodiments, which will be described in detail below together with the accompanying drawings. However, the present disclosure is not limited to the embodiments disclosed below, and the present disclosure is only defined by the scope of the claims. Even unless defined, all terms (including technical or scientific terms) used herein have the same meaning as those generally received by a general technology in the related art.

In the description of the present disclosure, a detailed description of known technology related to the present disclosure may be omitted when it is determined to unnecessarily obscure the subject matter of the present disclosure. Then, the following terms are terms defined considering the functions of the present disclosure, and this may be changed according to the intention or the custom of a user and an operator, etc. Therefore, the definition should be based on the contents throughout this specification. In the drawings of the present disclosure, the same reference numerals are used as many as possible for the same or corresponding configurations. To facilitate understanding of the present disclosure, some configurations in the drawings may be shown somewhat exaggerated or reduced.

The following description is only one means for efficiently explaining the technical sprit of the present disclosure for those skilled in the art to which the present disclosure pertains, and the terms used in the present application are used for explaining only specific embodiments and are not intended to limit the present disclosure. The singular expressions include plural expressions unless the context clearly dictates otherwise.

In the present application, it should be understood that the terms "comprises," "having," or "providing," etc. are intended to specify the presence of stated features, integers, steps, operations, components, parts or combinations thereof, and not to exclude in advance the presence or addition possibility of one or more other features or integers, steps, operations, components, parts or combinations thereof.

A stretchable conductive connection-based stretchable electronic device according to an embodiment of the present disclosure may be provided with a stretchable conductive connecting body having stretchability on a stretchable board (e.g., stretchable PCB), and an electric part (e.g., rigid IC chip) may be mounted on a stretchable board through the stretchable conductive connecting body.

According to this embodiment, it is possible to electrically connect the high-performance IC chip on the stretchable/flexible PCB through the stretchable conductive connecting body of the three-dimensional structure, thereby minimizing the stress/strain applied to the IC chip by the stretchable conductive connecting body.

Therefore, according to this embodiment, it is possible to prevent deterioration of the performance of the IC chip even when it is used in a wearable electronic device and the stress/strain such as tensile/compression/bending excessively occur in the stretchable PCB.

In an embodiment, the upper surface of the stretchable conductive connecting body may be provided in the form capable of detaching/attaching the IC chip by a conductive sucker such as a conductive suction plate, a conductive suction cavity, various sizes (nano/micro scale) of conductive minute suction cavities, or a composite structure thereof. Therefore, it is possible to easily perform the replacement/upgrade, etc. of the IC chip on the stretchable board.

In an embodiment, the stretchable conductive connecting body may have a conductive adhesive material, a conductive sucker (conductive suction plate, conductive suction cavity, various sizes of conductive minute suction cavities or a composite structure thereof), or a composite form of the above material and structure, which may firmly keep the electrical contact state between the stretchable/flexible PCB and the rigid IC chip even when the stress/strain occur on the stretchable board.

In an embodiment, the stretchable conductive connecting body may be prepared in a structure in which modulus of elasticity is gradually changed (e.g., a change in modulus of elasticity in the order of liquid metal, conductive stretchable polymer, Ionic Conductor, and elastomer), thereby maximizing the bonding performance between the stretchable PCB and the IC chip while minimizing the stress/strain applied to the stretchable conductive connecting body.

In an embodiment, the stretchable conductive connecting body may be provided in a spring structure, a three-dimensional fractal, or a three-dimensional spring/fractal composite structure in order to minimize the stress/strain and a change in the electrical characteristics applied to the IC chip.

Figure 1B:
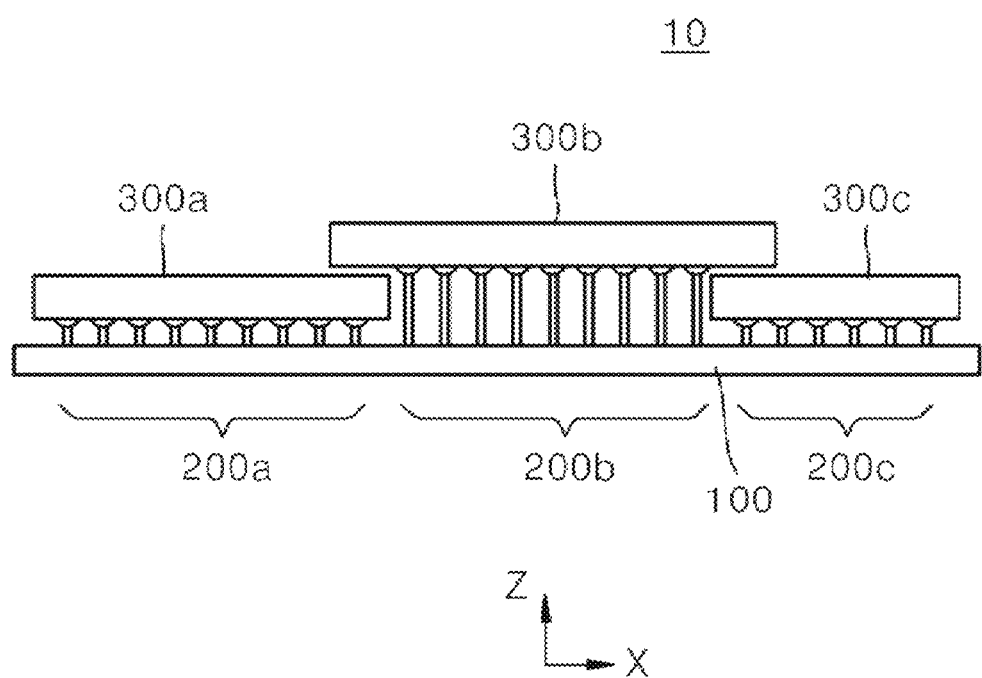
FIG. 1B is a side diagram showing a stretchable electronic device according to another embodiment of the present disclosure.
Figure 2:
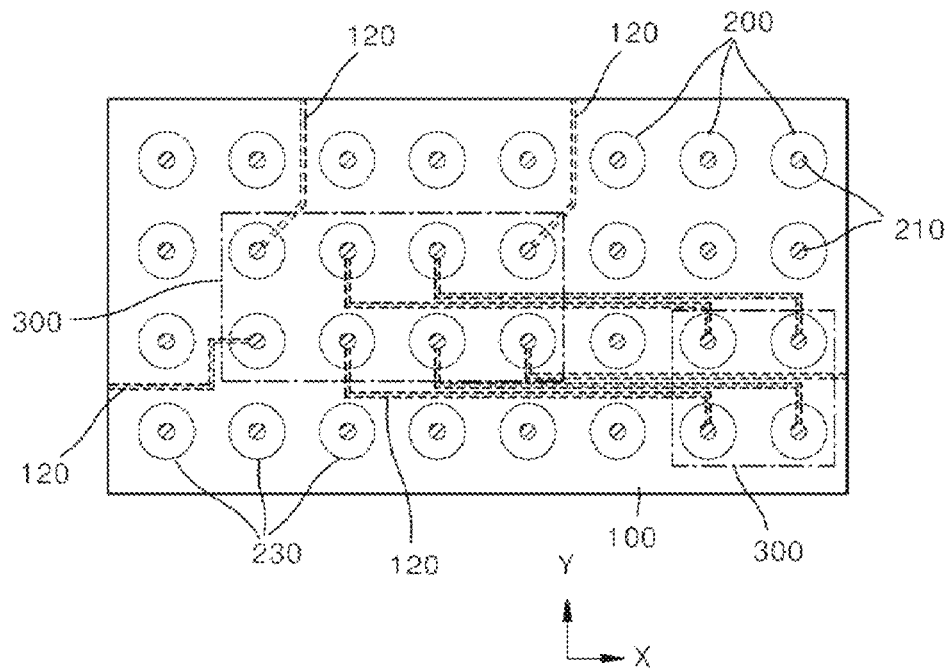
FIG. 2 is a plane diagram showing a stretchable board and a plurality of stretchable conductive connecting bodies constituting the stretchable electronic device according to an embodiment of the present disclosure.

FIG. 1A is a side diagram of a stretchable electronic device according to an embodiment of the present disclosure. FIG. 1B is a side diagram of a stretchable electronic device according to another embodiment of the present disclosure. FIG. 2 is a plane diagram showing a stretchable board and a plurality of stretchable conductive connecting bodies constituting the stretchable electronic device according to an embodiment of the present disclosure.

Referring to FIGS. 1A, 1B, and 2, a stretchable electronic device 10 may include a stretchable board 100, a plurality of stretchable conductive connecting bodies 200 provided on the stretchable board 100, and a plurality of electric parts 300 mounted on the stretchable board 100 through the plurality of stretchable conductive connecting bodies 200.

The stretchable board 100 may be provided as a stretchable board and a flexible board. The stretchable board 100 may be provided in a thin plate shape. In an embodiment, the stretchable board 100 may have a conductive channel 120 having an electronic circuit therein, such as a Printed Circuit Board (PCB).

The stretchable board 100 has a conductive channel (first conductive channel) 120 constituting a plurality of electric circuits therein. The first conductive channel 120 may be made of a stretchable conductive material, for example, nanowire such as metal, Carbon Nano Tube (CNT), graphene, liquid metal (e.g., EGaIn), conductive stretchable polymer, Ionic Conductor, or a compound thereof, etc. That is, the first conductive channel 120 may be provided as a circuit channel of a stretchable electronic device corresponding to the movement of the stretchable board 100. For this purpose, the first conductive channel 120 may be provided in a serpentine or spring structure.

The first conductive channel 120 may be provided as a nano or micro-sized channel. The first conductive channel 120 may be designed to perform the functions such as applying current/voltage (e.g., ground voltage, power source voltage, etc.) to the electric parts 300, transferring a control signal thereto, performing communication, or electrically connecting between the terminals of the electric parts 300.

The stretchable board 100 may be made of a material that is stretchable or bendable, for example, a silicon-based material, etc. such as silicon-based polymer (Polydimethylsiloxane (PDMS)), but is not limited thereto.

The stretchable conductive connecting body 200 may be made of a stretchable material that is stretchable or bendable. The stretchable conductive connecting body 200 may be formed in the direction perpendicular to and away from the surface (plane) 110 of the stretchable board 100, and may form a three-dimensional stereoscopic structure for mounting the electric parts 300 on the surface 110 of the stretchable board 100.

In an embodiment, the stretchable conductive connecting body 200 may be made of the same material as the stretchable material of the stretchable board 100 to be formed integrally with the stretchable board 100, or manufactured separately from the stretchable board 100 to be coupled to the surface 110 side of the stretchable board 100.

Figure 3A:
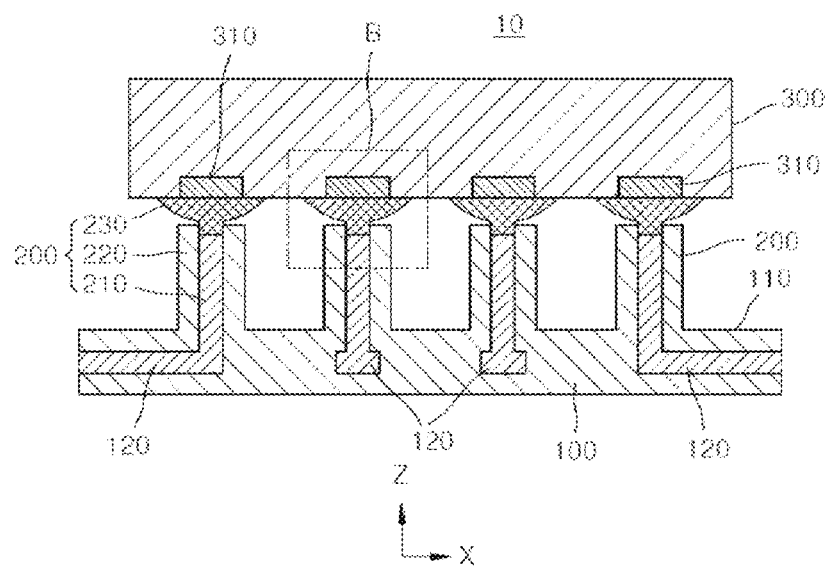
FIG. 3A is a cross-sectional diagram showing the enlarged portion 'A' in FIG. 1A.
Figure 3B:
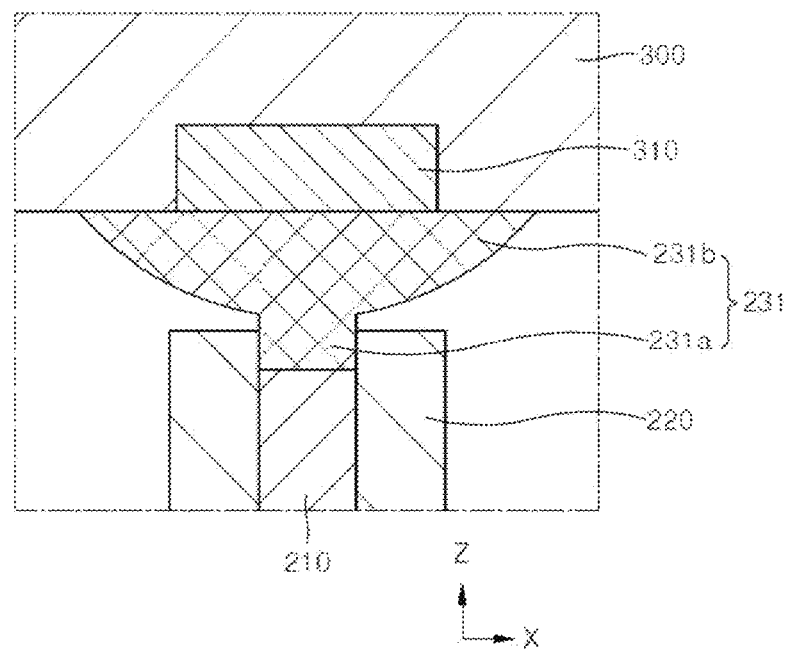
FIGS. 3B and 3C are diagrams of the enlarged portion 'B' in FIG. 3A.
Figure 3C:
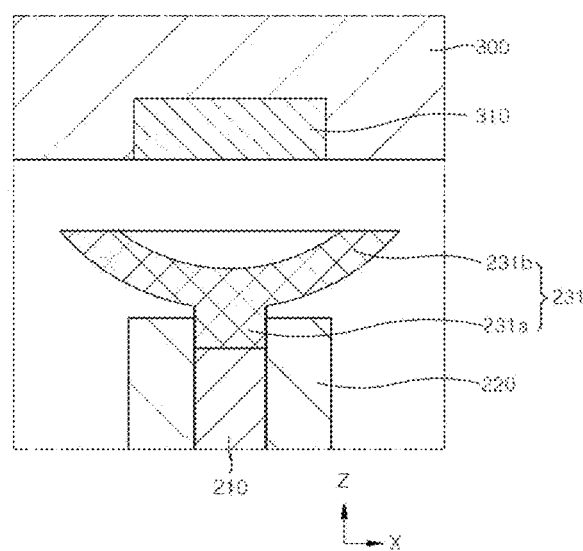

FIG. 3A is a cross-sectional diagram showing the enlarged portion 'A' in FIG. 1. FIGS. 3B and 3C are diagrams of the enlarged portion 'B' in FIG. 3A. Particularly, FIG. 3B shows a state where the electric part 300 has been attached (sucked) to the stretchable conductive connecting body 200, and FIG. 3C shows a state where the electric part 300 has been separated from the stretchable conductive connecting body 200.

Referring to FIGS. 1A to 3C, a plurality of stretchable conductive connecting bodies 200 are extended in the direction away from the surface 110 of the stretchable board 100 to form the three-dimensional stereoscopic structure on the surface 110 of the stretchable board 100.

The electric parts 300 are attached to the plurality of stretchable conductive connecting bodies 200 formed to be protruded to have the stereoscopic structure from the surface 110 of the stretchable board 100 to be mounted on the stretchable board 100, and simultaneously, electrically connected to the stretchable board 100.

The stretchable conductive connecting body 200 may be formed in a column shape such as a cylinder or a polygonal column (square column) to be extended and protruded in the direction Z perpendicular to the surface 110 of the stretchable board 100 and in the direction away therefrom.

The stretchable conductive connecting body 200 may include a conductive channel (second conductive channel) 210, a stretchable member 220 for surrounding the side surface of the second conductive channel 210, and a conductive connecting part 230 for attaching the upper surface of the stretchable conductive connecting body 200 to the electric part 300. The second conductive channel 210 may be provided as a nano or micro-sized channel.

The second conductive channel 210 is electrically connected to the first conductive channel 120 of the stretchable board 100. The second conductive channel 210 provides the function of electrically connecting the electrode 310 of the electric part 300 to the first conductive channel 120 of the stretchable board 100. Through the connection, the second conductive channel 210 may be designed to perform the function such as applying current/voltage (e.g., ground voltage, power source voltage, etc.) to the electric parts 300, transferring a control signal thereto, performing communication, or electrically connecting between the terminals of the electric parts 300, etc.

The second conductive channel 210 may be made of a stretchable conductive material, for example, conductive liquid metal (e.g., EGaIn), a conductive (metal material, etc.) nanowire, Carbon Nano Tube (CNT), graphene, conductive stretchable polymer, Ionic Conductor, or a compound thereof.

The stretchable member 220 may be provided in a column shape such as a circular shape or a polygonal shape (square shape), but is not limited thereto. The stretchable member 220 may be made of a material that is stretchable or bendable, for example, a silicone-based insulating material such as silicon-based polymer (Polydimethylsiloxane (PDMS)), etc., but is not limited thereto.

The conductive connecting part 230 may include a sucker for vacuum-suctioning the upper surface of the stretchable conductive connecting body 200 to the electric part 300 so that the conductive channel 210 is electrically connected to the electrode 310 of the electric part 300. In an embodiment of FIGS. 1A to 3C, the sucker may include a shape of a conductive suction plate 231.

Although not shown in FIGS. 1A to 3C, the stretchable conductive connecting body 200 may include the conductive suction plate 231, a suction cup (e.g., reference numeral 232 in FIG. 4B), a suction cavity (e.g., reference numeral 236 in FIG. 22) or a composite structure thereof. Alternatively, the conductive connecting part 230 may include a conductive adhesive material (conductive adhesive agent) as well as the sucker, or may also be provided in the composite form of the conductive adhesive material and the sucker.

The conductive suction plate 231 may be provided to contact the upper end portion of the stretchable conductive connecting body 200. In an embodiment, the conductive suction plate 231 may include a body 231a made of a conductive material (e.g., conductive stretchable polymer) to be inserted into and coupled to a hole formed in the upper end central portion of the stretchable member 220, and a suction plate 231b of a conductive material formed on the upper surface portion of the body 231a.

The suction plate 231b may be extended in the radius direction from the body 231a so as to have a larger area than the body 231a, and provided in a cup or cap shape having a concave curved surface toward the central portion thereof. The conductive suction plate 231 may be made of a stretchable conductive material.

In another embodiment, instead of the conductive suction plate 231, it is also possible to bond the stretchable conductive connecting body 200 and the electric part 300 by a conductive adhesive agent. In this case, the conductive connecting part 230 of the stretchable conductive connecting body 200 may further include the conductive adhesive agent.

The electric part 300 may include one or more electrodes 310 in the form of a terminal. An IC chip has four, six, eight, and ten terminals or more. The electrode 310 may be formed on the lower surface of the electric part 300. In an embodiment, the electric part 300 may be an integrated circuit chip.

The electric part 300 may, for example, include various Integrated Circuit (IC) chips such as a Central Processing Unit (CPU), a graphic card, a memory such as a solid state drive (SSD) or Random Access Memory (RAM), and a sensor, but is not limited thereto.

The electric part 300 is attached to the stretchable conductive connecting bodies 200 to be supported in a state spaced apart from the surface 110 of the stretchable board 100.

Therefore, since the electric part 300 is not directly bonded to the surface 110 of the stretchable board 100, the stress/strain of the stretchable board 100 may be prevented from being directly transferred to the electric part 300.

The stretchable conductive connecting bodies 200 may be arranged on the upper surface of the stretchable board 100 in the form of a matrix, or provided at a predetermined mounting position of the electric parts 300. The arrangement and spacing of the stretchable conductive connecting bodies 200 may be set in the same manner as the arrangement and spacing of the electrodes 310 of the electric parts 300.

As shown in FIG. 1A, the electrodes 310 of the electric part 300 may be disposed at the same height. As described above, the group of the stretchable conductive connecting bodies 200 provided for attaching to the electrodes 310 of the electric part 300 disposed at the same height may be formed to all have the same length for attaching to the electrodes 310 of the electric part 300 to have the constant upper end height.

However, as shown in FIG. 1B, the electric part 300 may be provided in various sizes and areas. In this case, the groups 200a, 200b, 200c of the stretchable conductive connecting bodies 200 provided for attaching various sizes of the electric parts 300a, 300b, 300c may be formed to have mutually different lengths for attaching all of the electric parts 300 to the stretchable board 100 having the limited surface 110, and the horizontal interference arrangement between the various electric parts 300a, 300b, 300c may be prevented. In addition, it is possible to reduce the mounting area of the electric parts 300a, 300b, 300c to downsize the stretchable electronic device 10.

Figure 4A:
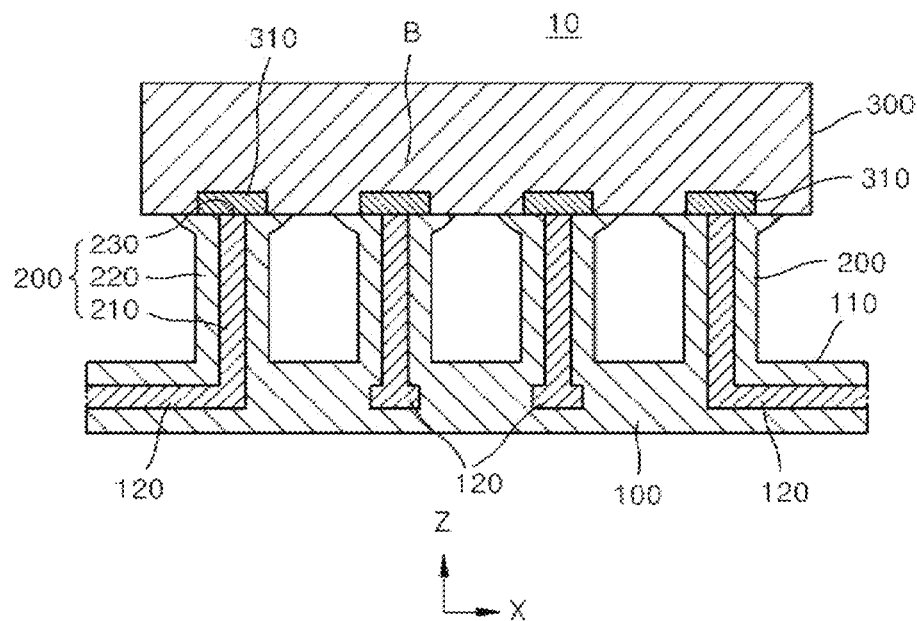
FIGS. 4A and 4B are cross-sectional diagrams showing the enlarged portion 'A' in FIG. 1A, and diagrams showing another embodiment of the stretchable conductive connecting body.
Figure 4B:
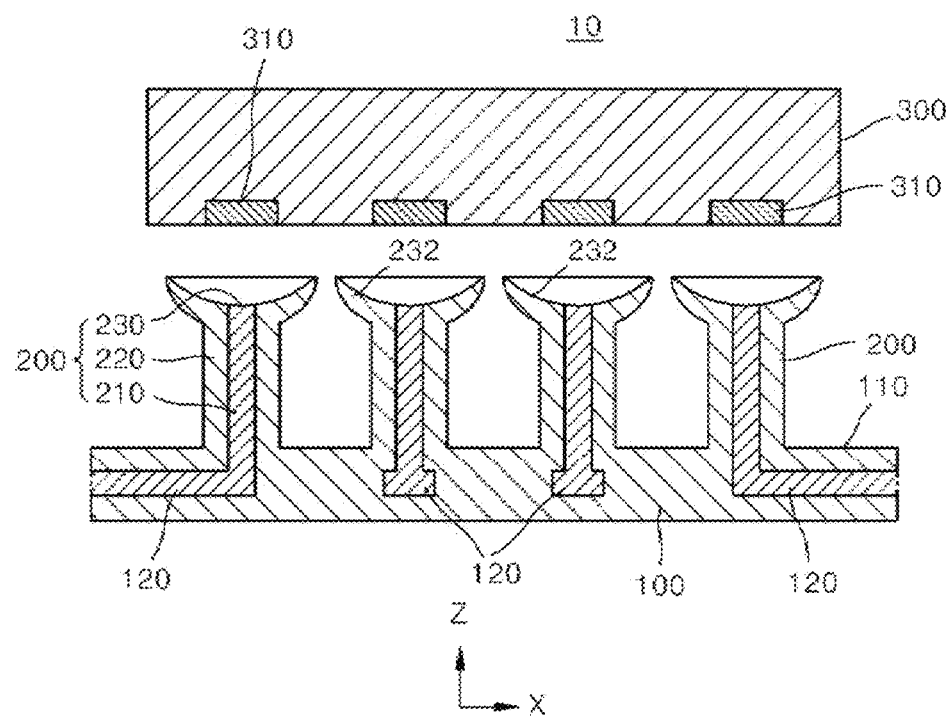

FIGS. 4A and 4B are cross-sectional diagrams showing a portion of a stretchable electronic device according to another embodiment of the present disclosure. Particularly, FIG. 4A shows a state where the electric part 300 has been attached (sucked) to the stretchable conductive connecting body 200, and FIG. 4B shows a state where the electric part 300 has been separated from the stretchable conductive connecting body 200.

The stretchable electronic device according to an embodiment of FIGS. 4A and 4B is different from an embodiment in FIGS. 3A to 3C in that the conductive connecting part 230 includes the suction cup 232 prepared on the upper end portion of the stretchable member 220.

In an embodiment of FIGS. 4A and 4B, the suction cup 232 may be made of the same material as the stretchable member 220 or a material having a high bonding force with the electric part. The suction cup 232 may be provided in a cup or cap shape having a downwardly concave curved surface. The central portion of the suction cup 232 may have the upper surface of the conductive channel 210 exposed upwards or may be provided with the conductive connecting part 230 to be contacted/connected with the electrode 310 of the electric part 300.

Figure 5A:
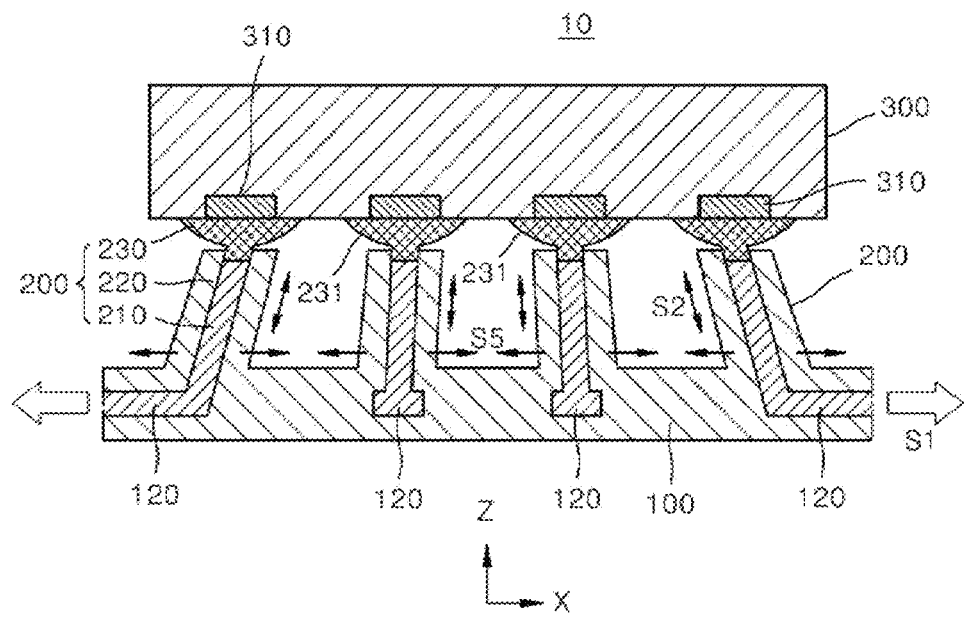
FIGS. 5A to 7C are cross-sectional diagrams showing a state where various stresses/strains have been applied to the stretchable electronic device according to an embodiment of the present disclosure.

FIGS. 5A to 7C are cross-sectional diagrams showing a state where various stresses/strains have been applied to the stretchable electronic device according to an embodiment of the present disclosure. Particularly, FIG. 5A shows a state where the stretchable board 100 shown in FIG. 3A has become tensile in the horizontal direction X, and FIG. 5B shows a state where the stretchable board 100 shown in FIG. 3A has been compressed in the horizontal direction X.

As shown in FIG. 5A, when the column strain S1 in the horizontal direction X is applied to the stretchable board 100, the stretchable conductive connecting bodies 200 are stretched to occur the column strain S2 in the longitudinal direction of the stretchable conductive connecting bodies 200, and to occur the column strain S5 in the horizontal direction.

Figure 5B:
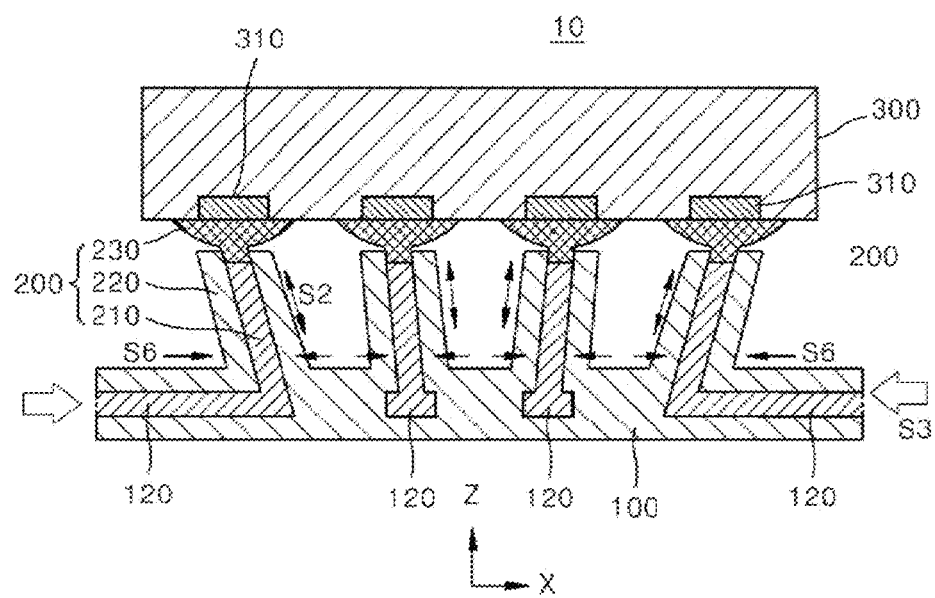

Conversely, as shown in FIG. 5B, when the compressive strain S3 in the horizontal direction X is applied to the stretchable board 100, the stretchable conductive connecting bodies 200 are stretched to occur the column strain S2 in the longitudinal direction of the stretchable conductive connecting bodies 200, and to occur the compressive strain S6 in the horizontal direction. As described above, when the stretchable conductive connecting body 200 becomes the column or compressive strain in the longitudinal direction and/or the horizontal (plane) direction according to the column/compressive strain of the stretchable board 100, the strain increasing rate of the stretchable conductive connecting body 200 as the strain of the stretchable board 100 increases is reduced/alleviated by the three-dimensional structure of the stretchable conductive connecting body 200, thereby minimizing the stress/strain transferred to the electric part 300.

In addition, the lower region of the stretchable conductive connecting bodies 200 is expanded or contracted in the horizontal direction X by a tensile or compressive force to absorb the stress, and the column or compressive strain in the horizontal direction X is reduced toward the upper portions of the stretchable conductive connecting bodies 200. Therefore, the stress/strain transferred to the electric part 300 is minimized.

Figure 6A:
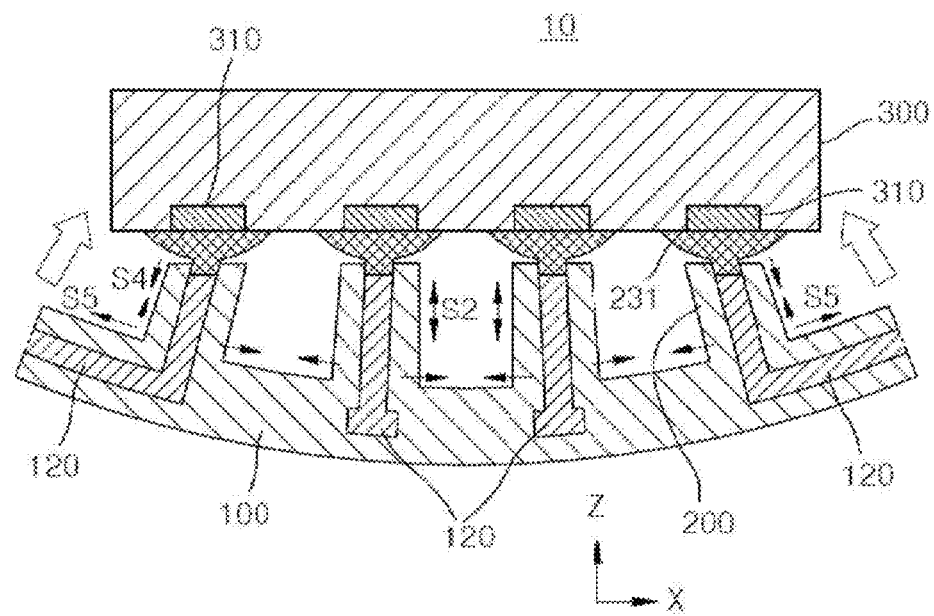
Figure 6B:
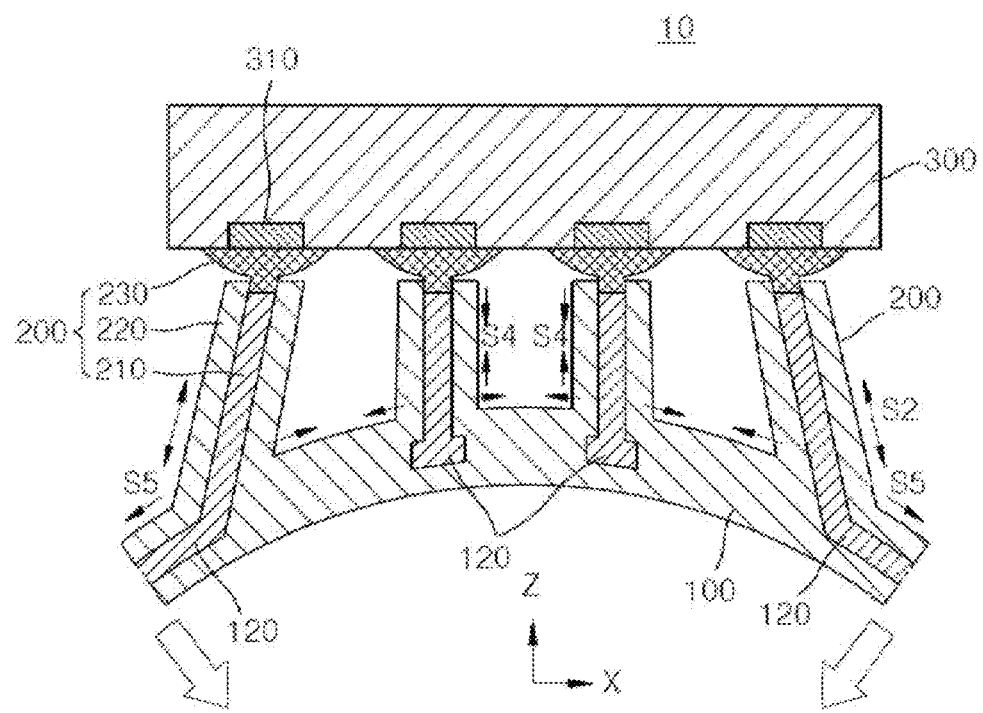

FIG. 6A shows a state where the stretchable board 100 shown in FIG. 3A has been concavely bent downwards, and FIG. 6B shows a state where the stretchable board 100 shown in FIG. 3A has been convexly bent upwards.

As shown in FIG. 6A, when the stretchable board 100 is concavely bent downwards, the stretchable conductive connecting bodies 200 become the column strain S5 in the horizontal direction, the inner stretchable conductive connecting body 200 becomes the column strain S2 in the longitudinal direction, and the outer stretchable conductive connecting body 200 becomes the compressive strain S4 in the longitudinal direction.

Conversely, as shown in FIG. 6B, when the stretchable board 100 is convexly bent upwards, the inner stretchable conductive connecting body 200 becomes the compressive strain S4 in the longitudinal direction, and the outer stretchable conductive connecting body 200 becomes the column strain S2 in the longitudinal direction.

As described above, according to the bending direction and the bending degree of the stretchable board 100, the stretchable conductive connecting bodies 200 having the three-dimensional structure become the column or compressive strain in the longitudinal direction, and the strain increasing rate of the stretchable conductive connecting body 200 as the strain of the stretchable board 100 increases is reduced/alleviated by the three-dimensional structure of the stretchable conductive connecting body 200, thereby minimizing the stress/strain transferred to the electric part 300.

Figure 7A:
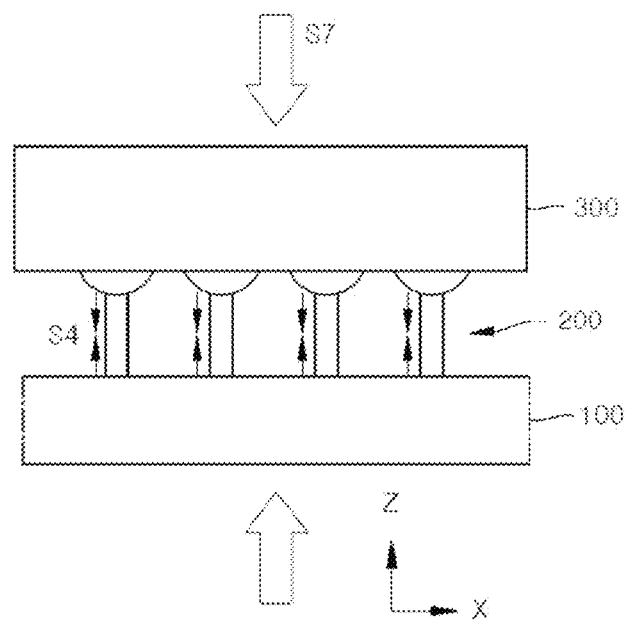
Figure 7B:
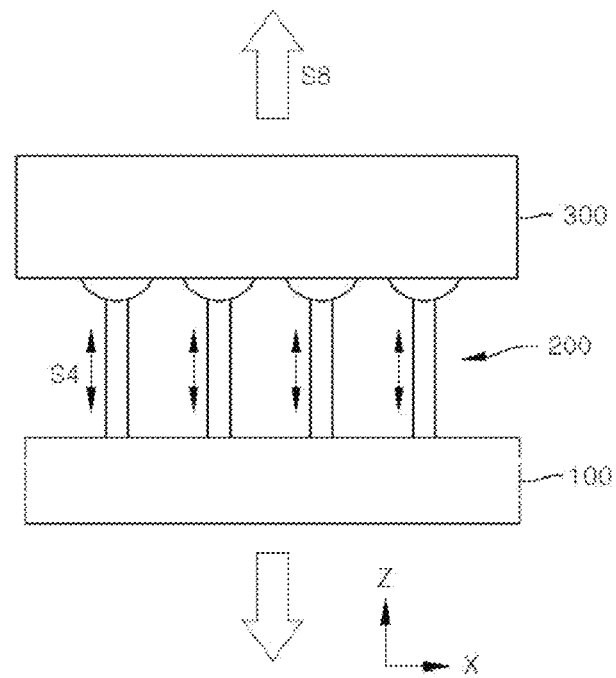
Figure 7C:
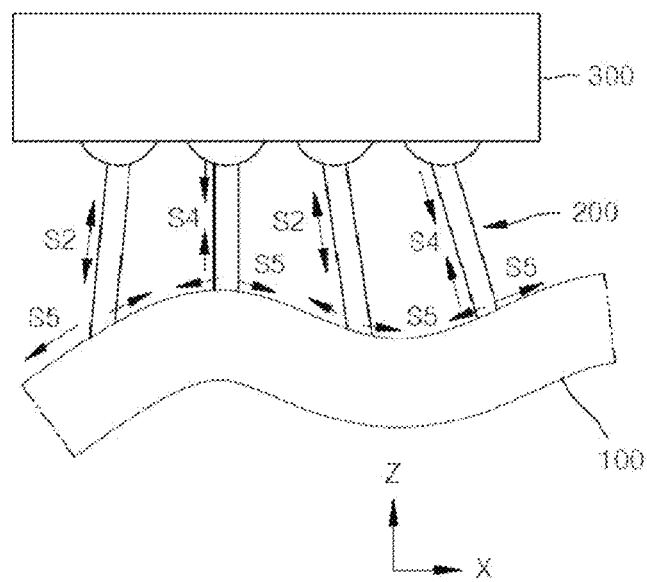

FIG. 7A shows a state where the stretchable electronic device 10 according to an embodiment of the present disclosure has been compressed in the vertical direction Z, FIG. 7B shows a state where the stretchable electronic device 10 according to an embodiment of the present disclosure has become tensile in the vertical direction Z, and FIG. 7C shows a state where the stretchable board constituting the stretchable electronic device according to an embodiment of the present disclosure has been deformed into various forms.

As shown in FIG. 7A, when the compressive strain S7 in the vertical direction Z is applied to the stretchable electronic device 10, the compressive strain S4 occurs in the stretchable conductive connecting bodies 200 in the vertical direction Z.

Conversely, as shown in FIG. 7B, when the column strain S8 in the vertical direction Z is applied to the stretchable electronic device 10, the column strain S2 occurs in the stretchable conductive connecting bodies 200 in the vertical direction Z.

As described above, according to the compressive/column strain in the vertical direction of the stretchable electronic device 10, the stretchable conductive connecting bodies 200 having the three-dimensional structure absorb impact/stress through the column or compressive strain in the longitudinal direction, thereby minimizing the stress/strain transferred to the electric part 300.

In addition, as shown in FIG. 7C, even when the stretchable board 100 has been deformed into a complex form, the three-dimensional stretchable conductive connecting bodies 200 may become the compressive/column strain in the three-dimensional direction to reduce/alleviate the strain increasing rate and absorb the impact/stress, thereby minimizing the stress/strain applied to the electric part 300.

As described with reference to FIGS. 5A to 7C, when the stretchable electronic device 10 is deformed such as tensile/compression, or bending, the stress/strain is absorbed (alleviated) by the strain of the stretchable board 100 and the stretchable conductive connecting bodies 200, and the stress/strain acting on the electric part 300 is minimized by the stretchable conductive connecting bodies 200 of the three-dimensional structure.

Figure 8:
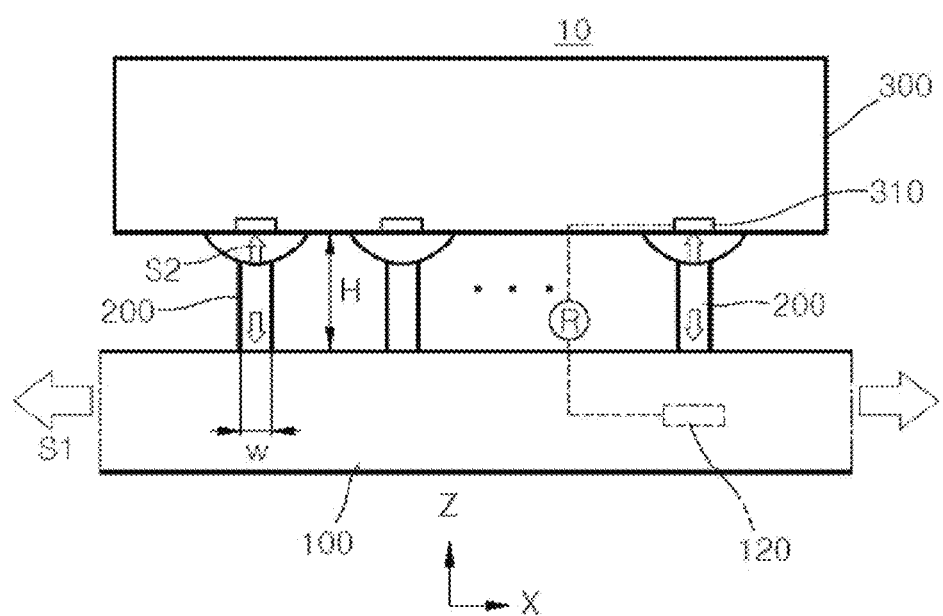
FIG. 8 is a schematic diagram of the performance evaluation test on the stretchable electronic device according to an embodiment of the present disclosure.

FIG. 8 is a schematic diagram of the performance evaluation test on the stretchable electronic device according to an embodiment of the present disclosure. Referring to FIG. 8, the column strain S2 and the resistance R acting on the column of the stretchable conductive connecting body 200 were measured, in a state where the horizontal column strain S1 has been applied to the stretchable board 100.

In order to evaluate the performance of the stretchable electronic device 10, the stretchable board 100 of 3 mm in thickness and the stretchable conductive connecting body 200 of 2.4 mm in diameter W were manufactured with a Tango Black Plus material by using a 3D printer, and then the stretchable conductive connecting body 200 was coupled to the stretchable board 100 or they were integrally manufactured. The stretchable conductive connecting body 200 was manufactured in the form of surrounding the conductive channel 210 of 1.2 mm in diameter by the stretchable member of 0.6 mm in thickness. The conductive channel 120 of the stretchable board 100 was manufactured to have 1.2 mm in diameter. The arrangement spacing of the stretchable conductive connecting bodies 200 was set to 10 mm.

The column strain S2 and the resistance R of the stretchable conductive connecting body 200 according to the aspect ratio (L/W) of the stretchable conductive connecting body 200 were measured by manufacturing the stretchable conductive connecting body 200 in various lengths L. In addition, a change in the column strain S2 of the stretchable conductive connecting body 200 according to the column strain S1 of the stretchable board 100 was measured while also changing variously the number of the arrangements of the stretchable conductive connecting body 200.

Figure 9:
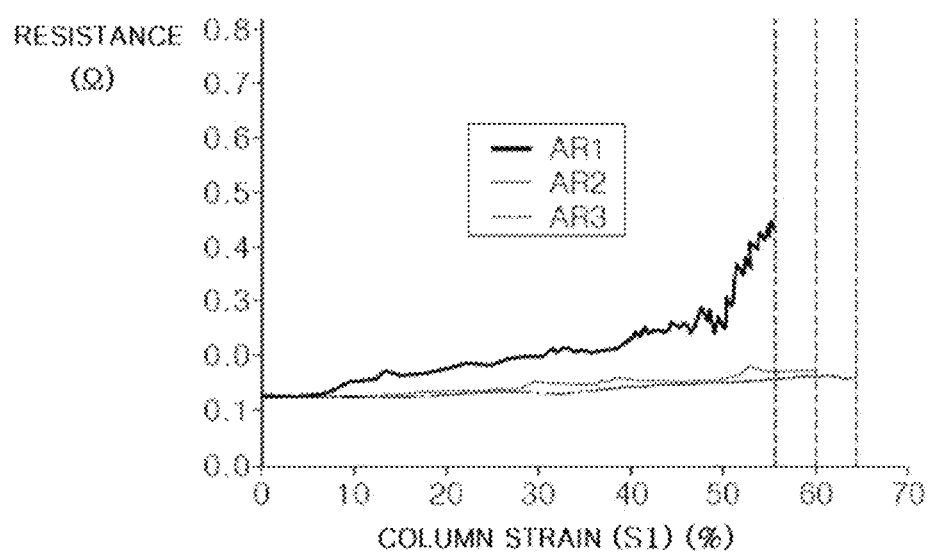
FIG. 9 is a graph showing a change in resistance of the stretchable conductive connecting body due to the column strain of the stretchable board constituting the stretchable electronic device according to an embodiment of the present disclosure.

FIG. 9 is a graph showing a change in the resistance of the stretchable conductive connecting body 200 due to the column strain of the stretchable board 100 constituting the stretchable electronic device according to an embodiment of the present disclosure. The column strain S1 of the stretchable board 100 indicated by the horizontal axis in FIG. 9 represents the ratio stretched by a tensile force based on a state where no tensile force is applied to the stretchable board 100.

AR1, AR2, and AR3 are measurement results when the aspect ratio (L/W) of the stretchable conductive connecting body 200 is 1, 2, and 3, respectively. It may be seen that when the aspect ratio of the stretchable conductive connecting body 200 is 1 (AR1), the resistance R of the stretchable conductive connecting body 200 slowly increases without rapid change until the column strain S1 of 50% acts on the stretchable board 100. In addition, when the aspect ratio of the stretchable conductive connecting body 200 was 1 (AR1), the resistance R of the stretchable conductive connecting body 200 was measured by a low value of 0.3Ω or less under the column strain S1 of 50% or less.

Reviewing a change in the resistance when the aspect ratio of the stretchable conductive connecting body 200 is 2 and 3 AR2 and AR3, it was measured that a change in the resistance of the stretchable conductive connecting body 200 was not large and the resistance value was kept a low value of 0.2Ω or less, even if the column strain of the stretchable board 100 was stretched to 60 to 65%.

It may be predicted that even if the stretchable electronic device 10 according to an embodiment of the present disclosure is applied to a wearable electronic device worn on the body because the tensile ratio of the body portion that most likely becomes tensile on the human body is about 50% or less, the stretchable conductive connecting body 200 may normally operate without degradation phenomenon of the electrical characteristics.

Figure 10:
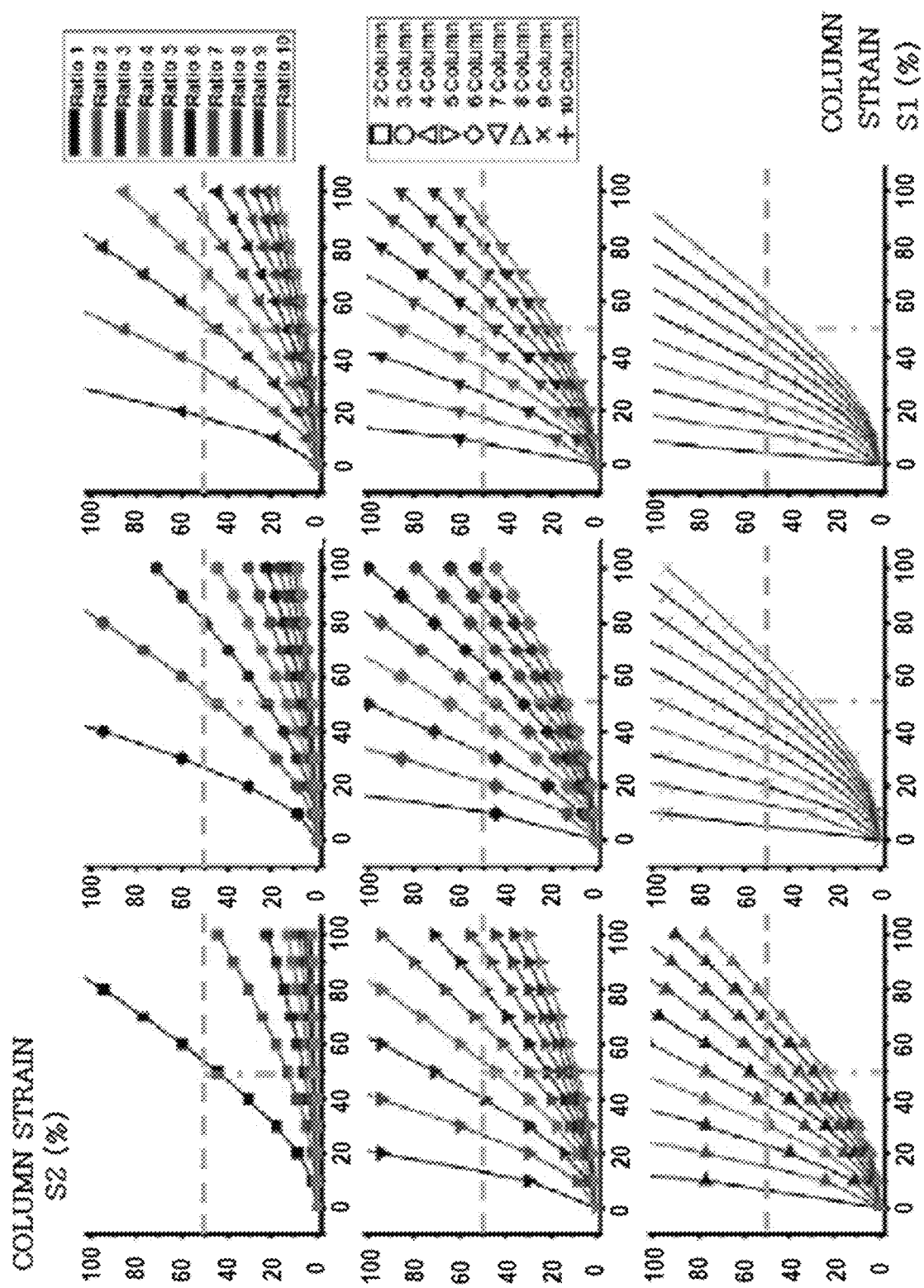
FIG. 10 is a graph showing a change in the column strain of the stretchable conductive connecting body due to the column strain of the stretchable board constituting the stretchable electronic device according to an embodiment of the present disclosure.

FIG. 10 is a graph showing a change in the column strain of the stretchable conductive connecting body 200 according to the column strain of the stretchable board 100 constituting the stretchable electronic device according to an embodiment of the present disclosure. In FIG. 10, the horizontal axis represents the column strain S1 of the stretchable board 100, and the vertical axis represents the change in the column strain S2 of the stretchable conductive connecting body 200 according to the column strain S1 of the stretchable board 100.

The change in the column strain S2 of the stretchable conductive connecting body 200 due to the column strain S1 of the stretchable board 100 was measured while changing the aspect ratio AR of the stretchable conductive connecting body 200 from 1 to 10 by one. In addition, the change in the column strain S2 of the stretchable conductive connecting body 200 due to the column strain S1 of the stretchable board 100 was measured while changing the number of the columns of the stretchable conductive connecting body 200 from 2 to 10. The column strain S2 of the stretchable conductive connecting body 200 shows a ratio of stretching by the tensile force based on the length of the stretchable conductive connecting body 200 in a state where no tensile force acts on the stretchable board 100.

It may be seen from FIG. 10 that the column strain S2 increases significantly as the number of the stretchable conductive connecting bodies 200 increases at a low aspect ratio, and in the case of the same number of stretchable conductive connecting bodies 200, the column strain S2 acting on the stretchable conductive connecting body 200 reduces as the aspect ratio increases. It is possible to prevent the column strain S2 acting on the stretchable conductive connecting body 200 from being excessively increased if the aspect ratio of the stretchable conductive connecting body 200 increases even if the number of the columns of the stretchable conductive connecting body 200 increases to 10.

Figure 11A:
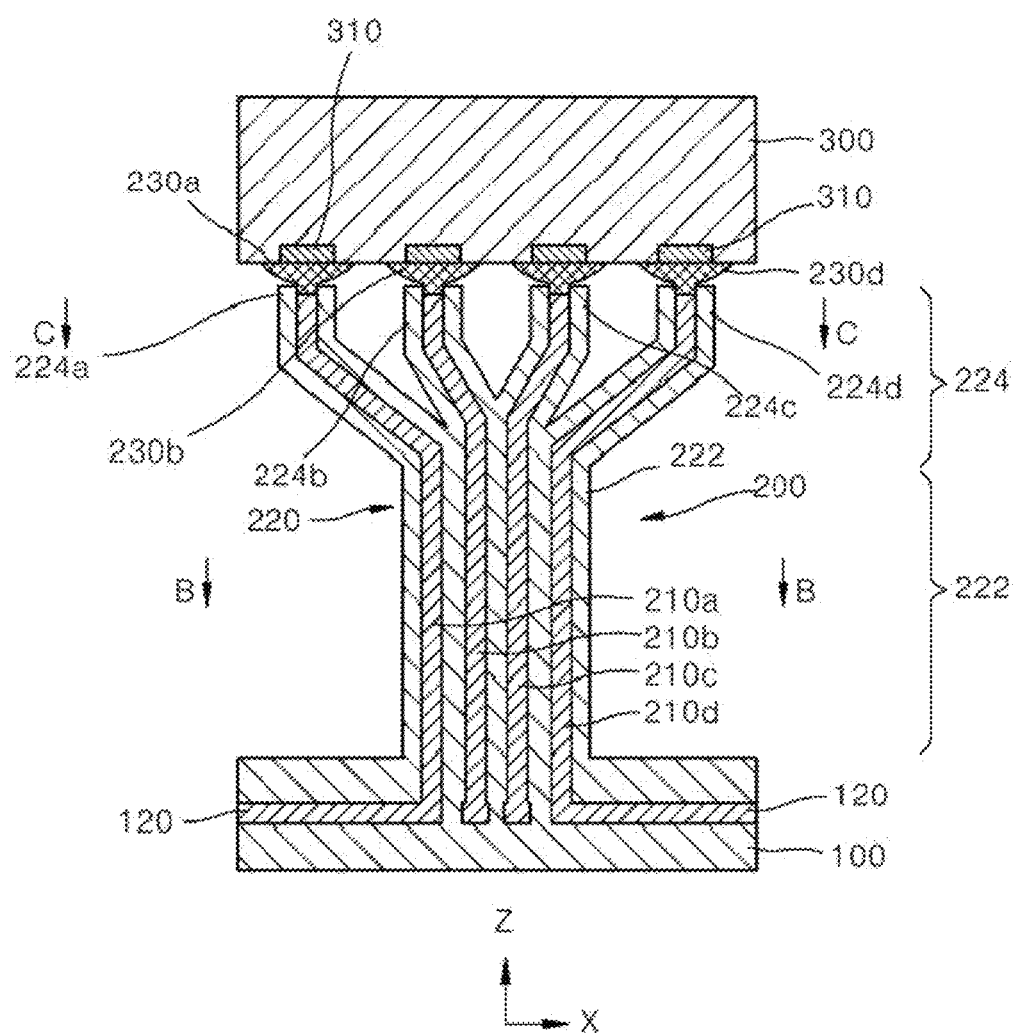
FIG. 11A is a diagram showing a portion of a stretchable electronic device according to still another embodiment of the present disclosure.

FIG. 11A is a diagram showing a portion of a stretchable electronic device according to still another embodiment of the present disclosure.

The stretchable electronic device shown in FIG. 11A differs from the above-described embodiments in that the stretchable conductive connecting body 200 has a three-dimensional fractal structure.

The stretchable conductive connecting body 200 includes a plurality of (multi-channel) conductive channels 210a, 210b, 210c, 210d. The plurality of conductive channels 210a, 210b, 210c, 210d are connected to a plurality of (multi-channel) electrodes 310 of the electric part 300, respectively.

The stretchable member 220 may include a lower shell 222 for entirely surrounding the plurality of conductive channels 210a, 210b, 210c, 210d, and a plurality of (multi-channel) branch shells 224a, 224b, 224c, 224d branched from the lower shell 222 to surround the plurality of conductive channels 210a, 210b, 210c, 210d, respectively.

The plurality of branch shells 224a, 224b, 224c, 224d have multi-channel conductive connecting parts 230a, 230b, 230c, 230d for bonding with the electric part 300 provided on the upper end portion thereof, respectively. The upper end portion of each of the conductive channels 210a, 210b, 210c, 210d in the plurality of branch shells 224a, 224b, 224c, 224d is connected to the electrode 310 of the electric part 300 by the conductive connecting parts 230a, 230b, 230c, 230d.

Figure 11B:
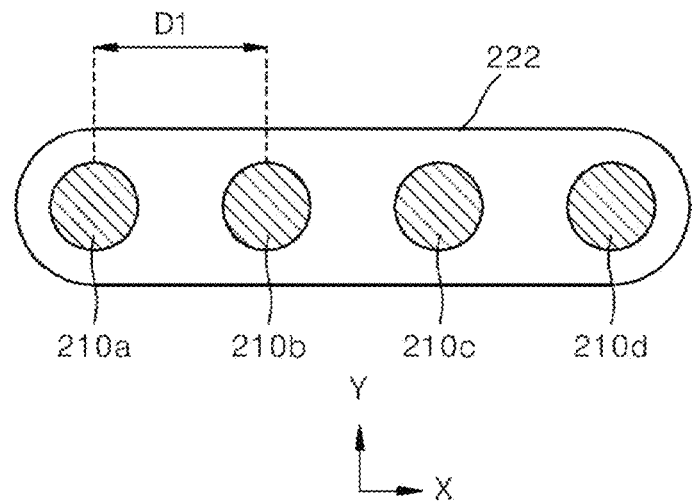
FIG. 11B is a cross-sectional diagram according to the line 'B-B' in FIG. 11A.
Figure 11C:
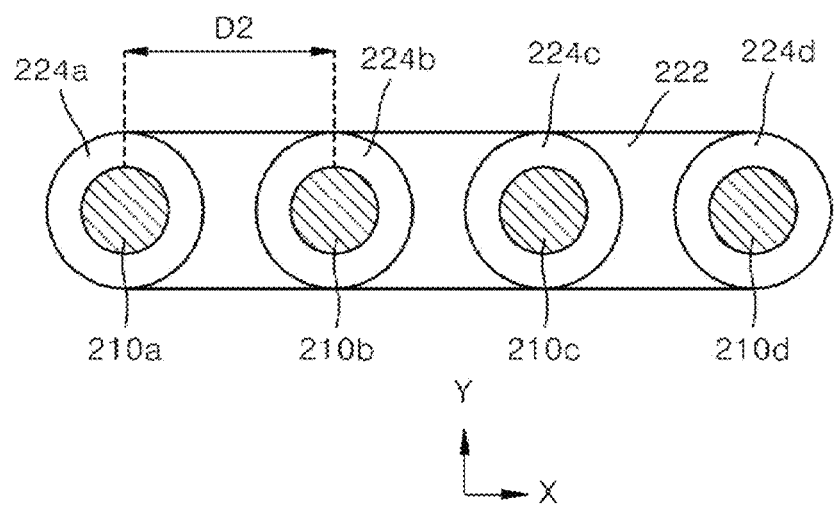
FIG. 11C is a cross-sectional diagram according to the line 'C-C' in FIG. 11A.

FIG. 11B is a cross-sectional diagram of the lower shell 222 taken along the line 'B-B' in FIG. 11A. FIG. 11C is a cross-sectional diagram of the branch shell 224 taken along the line 'C-C' in FIG. 11A.

Referring to FIGS. 11A to 11C, the upper side spacing D2 between the plurality of conductive channels 210a, 210b, 210c, 210d may be provided wider than the lower side spacing D1 for the three-dimensional fractal structure.

That is, it is possible to reduce the number of the columns of the stretchable conductive connecting body 200 contacting the stretchable board 100 while reducing the spacing between the plurality of branch shells 224a, 224b, 224c, 224d contacting the stretchable board 100 to the narrow spacing of the lower shell 222 through the three-dimensional fractal structure, thereby reducing the strain increasing rate of the plurality of branch shells 224a, 224b, 224c, 224d at the column strain/the compressive strain of the stretchable board 100 and reducing the stress/strain acting on the electric part 300.

Therefore, according to an embodiment shown in FIGS. 11A to 11C, it is possible to further reduce the stress/strain transferred to the electric part 300, and also to minimize the stress/strain acting between the electrodes 310 of the electric part 300 by the stretchable conductive connecting body 200 of the three-dimensional fractal structure composed of the plurality of branch shells 224a, 224b, 224c, 224d.

Generally, a high-performance IC chip is prepared with a large number of electrode wirings, and as the number of electrode wirings connected with the stretchable board 100 increases, the stress and strain applied to the electrode 310 of the electric part 300 and the stretchable conductive connecting body 200 are weighted, thereby greatly affecting a change in the resistance of the channel in the entire stretchable electronic device 10 as well.

However, if the electrode channel of the three-dimensional fractal structure is configured between the stretchable board 100 and the electric part 300 according to an embodiment in FIG. 11A, it is possible to minimize the stress/strain applied to the IC chip even in the case of the IC chip having a large number of electrode wirings, and to prevent degradation of the electric characteristics of the stretchable electronic device 10 due to the stress/strain.

That is, it is possible to keep the number of the wirings necessary for the electrical connection while reducing the area of the electrode wiring contacting the stretchable board 100, and also to couple the IC chip composed of a large number of wirings to the stretchable board 100 without the stress and the strain. Therefore, it is possible to sufficiently exert the performance without deteriorating the performance of the high-performance IC chip having a large number of electrode wirings even when it is applied to a wearable device and the stress/strain greatly occur in the stretchable board 100.

Figure 12:
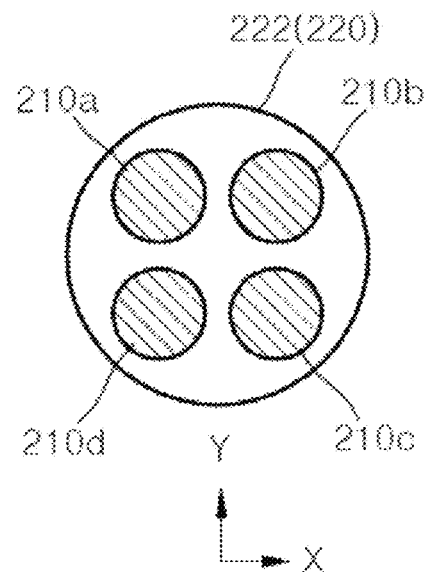
FIG. 12 is a cross-sectional diagram according to the line 'B-B' in FIG. 11A, and is a diagram showing the arrangement structure of the conductive channels constituting the stretchable electronic device according to still another embodiment of the present disclosure.

FIG. 12 is a cross-sectional diagram taken along the line 'B-B' in FIG. 11A, and is a diagram showing the arrangement structure of the conductive channels constituting the stretchable electronic device according to still another embodiment of the present disclosure.

As shown in FIG. 11B, the plurality of conductive channels 210a, 210b, 210c, 210d are not arranged in a line within the lower shell 222, and may also be arranged to have a constant angle with respect to the center of the lower shell 222 in a cylindrical shape in order to reduce the area of the electrode wiring contacting the stretchable board 100.

FIGS. 13A to 13D are side diagrams of the stretchable conductive connecting body constituting the stretchable electronic device according to still another embodiments of the present disclosure.

Figure 13A:
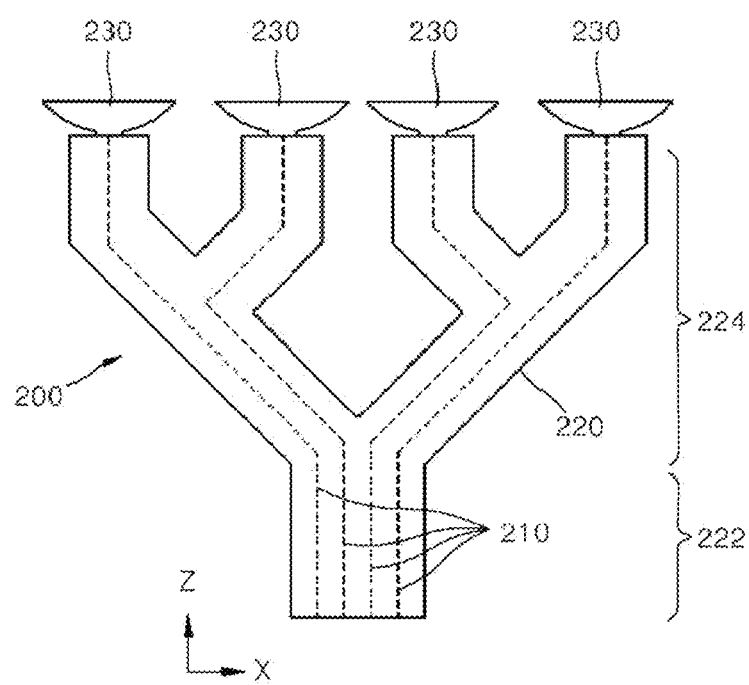
FIGS. 13A to 13D are side diagrams of a stretchable conductive connecting body constituting the stretchable electronic device according to yet another embodiments of the present disclosure.
Figure 13B:
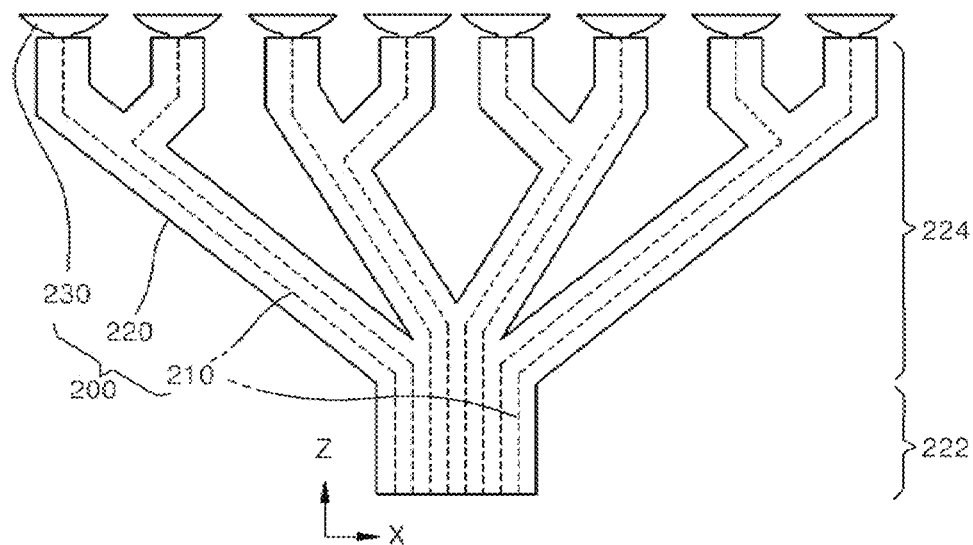
Figure 13C:
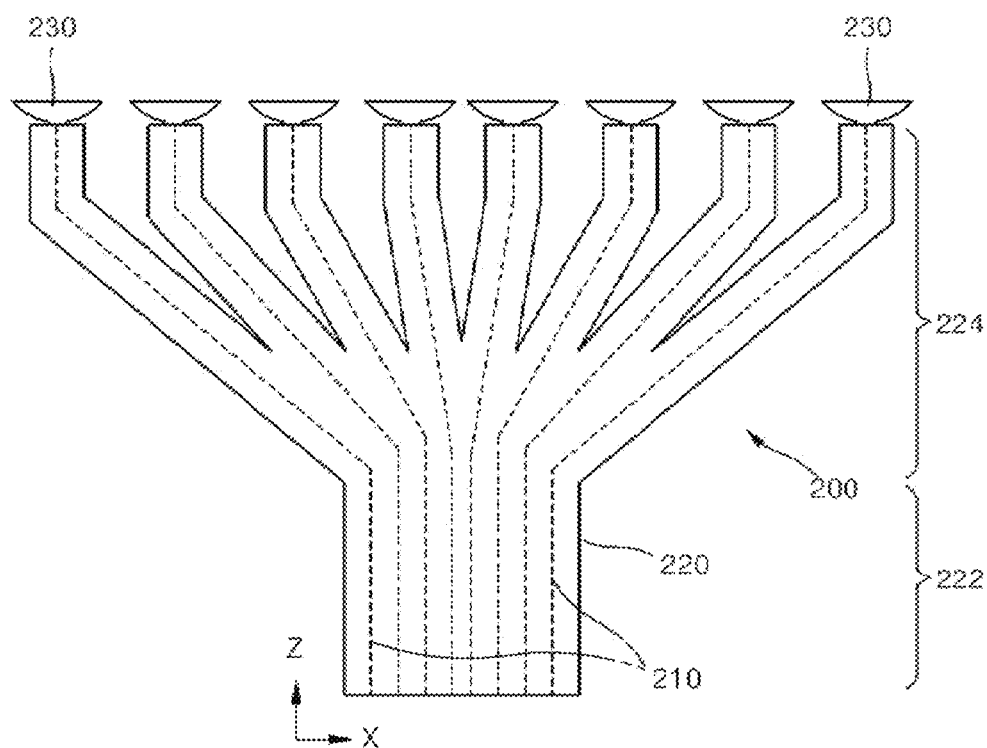
Figure 13D:
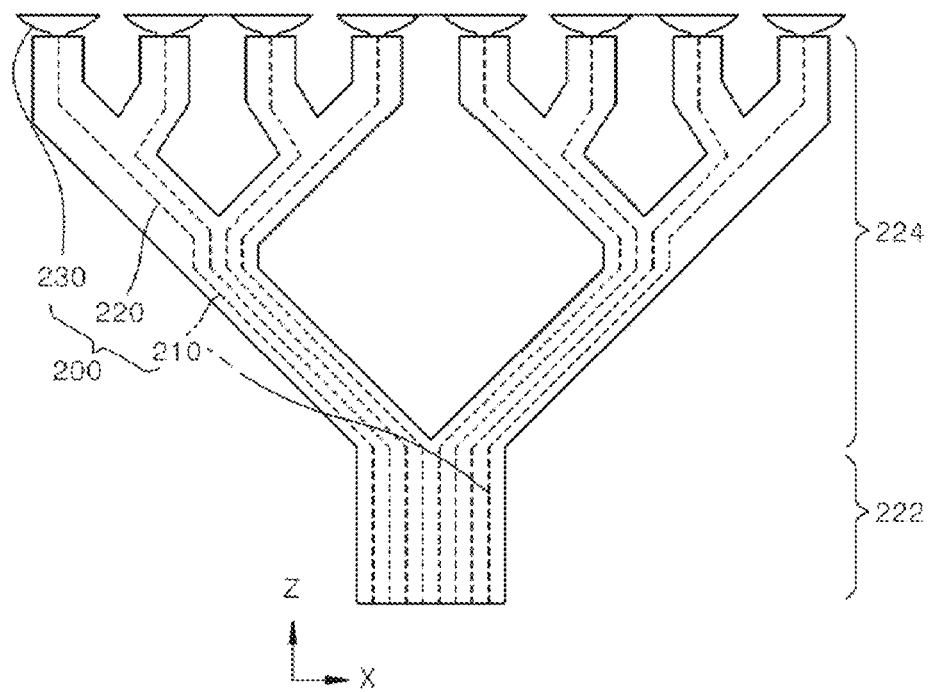

FIG. 11A shows that the stretchable conductive connecting body 200 is formed in the two-stage fractal structure, but as shown in FIGS. 13A, 13B, and 13D, may also be formed in a multi-stage fractal structure of three stages or more, and as shown in FIGS. 13B, 13C, and 13D, the number of branch shells 224 may also be variously increased to 6, 8, 10, 16 or more according to the number of electrodes of the electric part, and simultaneously, the structure thereof may also be changed into a multi-stage fractal structure of two stages or more.

Figure 14A:
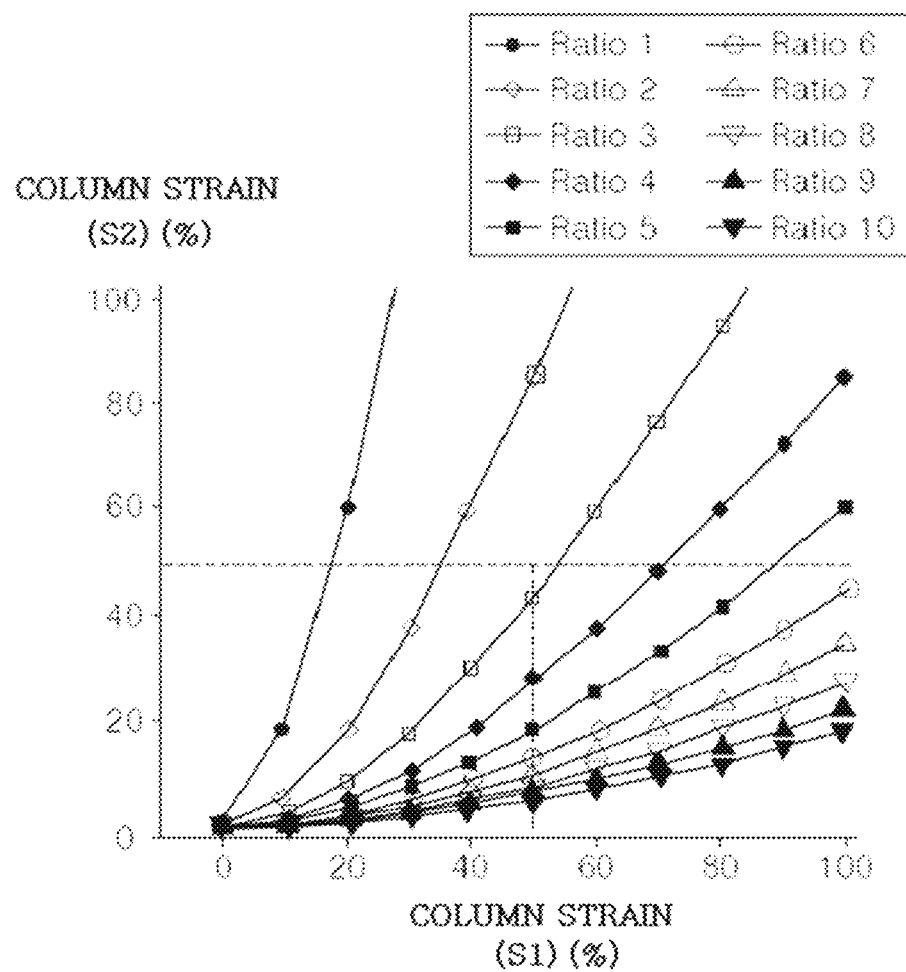
FIG. 14A is a graph showing the column strain characteristic of the stretchable electronic device according to an embodiment in FIG. 3A.
Figure 14B:
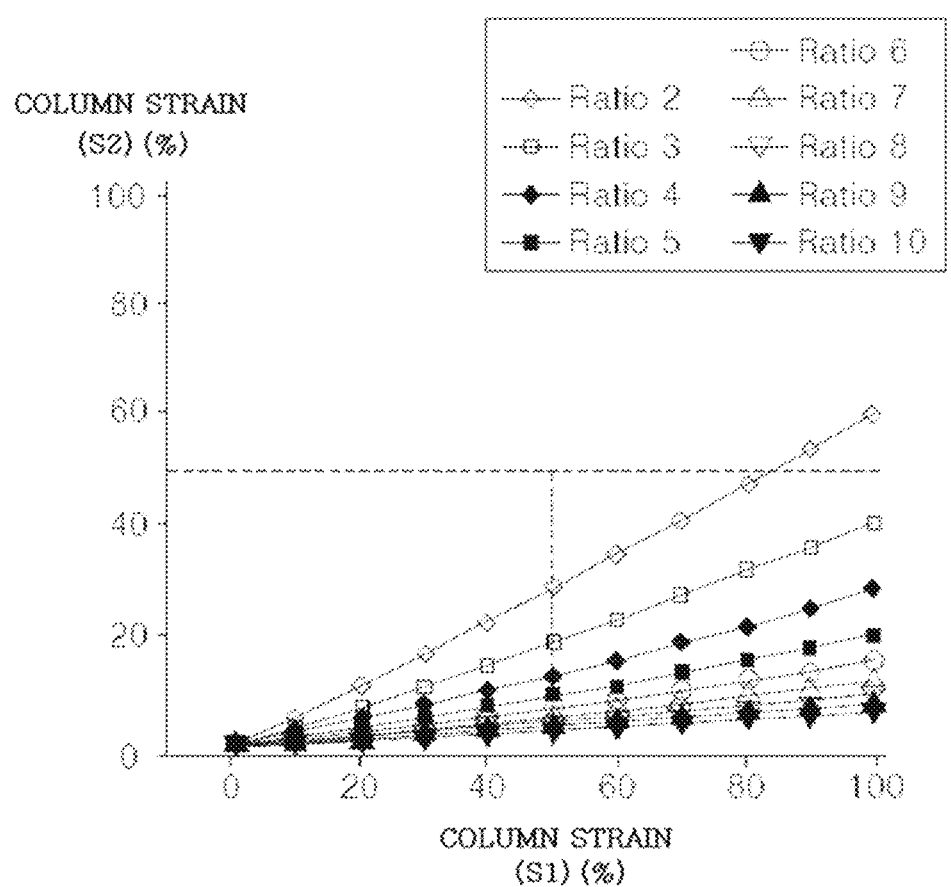
FIG. 14B is a graph showing the column strain characteristic of the stretchable electronic device according to an embodiment in FIG. 13A.

FIG. 14A is a graph showing the column strain characteristics of the stretchable electronic device according to an embodiment in FIG. 3A. FIG. 14B is a graph showing the column strain characteristics of the stretchable electronic device according to an embodiment in FIG. 13A.

The change in the column strain S2 of the stretchable conductive connecting body 200 due to the column strain S1 of the stretchable board 100 was measured while changing the aspect ratio of the stretchable conductive connecting body 200 from 1 to 10 (from 2 to 10 in FIG. 14B) by one. In an embodiment of FIGS. 14A and 14B, the number of conductive channels is 4. As may be seen from FIG. 14B, when the stretchable conductive connecting body 200 is formed in the three-dimensional fractal structure, the column strain of the stretchable conductive connecting body 200 remarkably reduces.

Figure 15A:
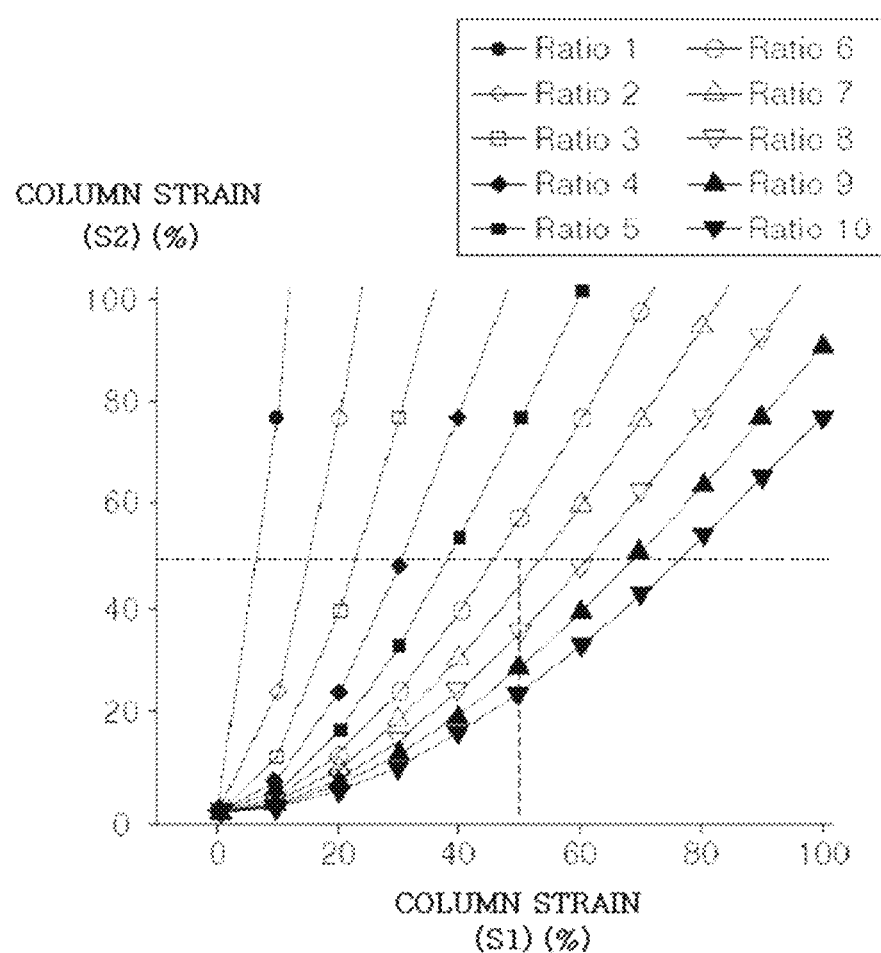
FIG. 15A is a graph showing the column strain characteristic of the stretchable electronic device in which the number of the stretchable conductive connecting bodies is 8 while having the stretchable conductive connecting body in FIG. 3A.
Figure 15B:
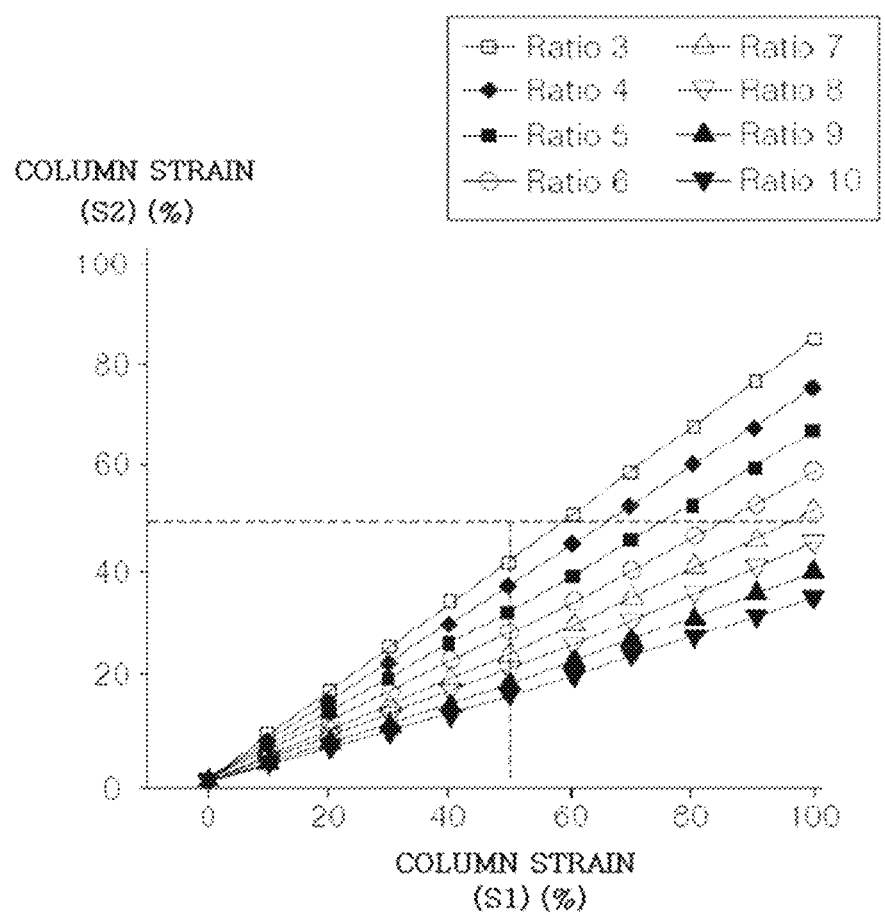
FIG. 15B is a graph showing the column strain characteristic of the stretchable electronic device in which the number of the conductive channels is 8 while having the stretchable conductive connecting body in FIG. 13D.

FIG. 15A is a graph showing the column strain characteristics of the stretchable electronic device in which the number of the stretchable conductive connecting bodies is 8 while having the stretchable conductive connecting body structure in FIG. 3A. FIG. 15B is a graph showing the column strain characteristics of the stretchable electronic device in which the number of the conductive channels is 8 while having the stretchable conductive connecting body structure in FIG. 13D.

It may be seen from FIG. 15B that the column strain remarkably reduces in the stretchable conductive connecting body 200 of the three-dimensional fractal structure even when the number of the conductive channels is 8.

Figure 16:
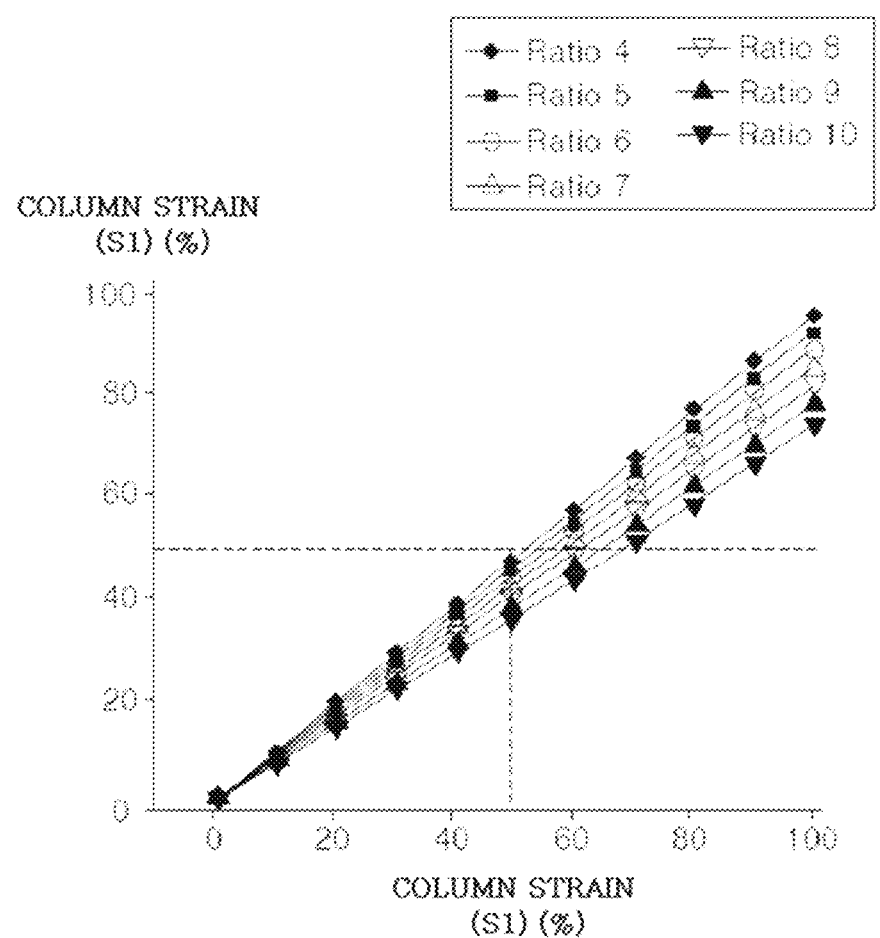
FIG. 16 is a graph showing the column strain characteristic of the stretchable electronic device in which the number of the conductive channels is 16 while having the stretchable conductive connecting body in FIG. 13D.

FIG. 16 is a graph showing the column strain characteristics of the stretchable electronic device in which the number of the conductive channels is 16 while having the stretchable conductive connecting body structure in FIG. 13D.

It may be seen from FIG. 16 that the column strain does not increase greatly if the stretchable board 100 and the electric part 300 are connected by the stretchable conductive connecting body 200 of the three-dimensional fractal structure even when the number of conductive channels is about 16.

Therefore, it may be seen that the change in the column strain S2 of the stretchable conductive connecting body 200 due to the column strain S1 of the stretchable board 100 may remarkably reduce if the stretchable conductive connecting body 200 has the three-dimensional fractal structure in the connection of the plurality of (multi-channel) stretchable conductive connecting bodies 200, and the stable electrical connection may be kept in the connection of the electric part of the Integrated Circuit (IC) requiring the plurality of (multi-channel) connections even when the stress/strain occur greatly.

Figure 17A:
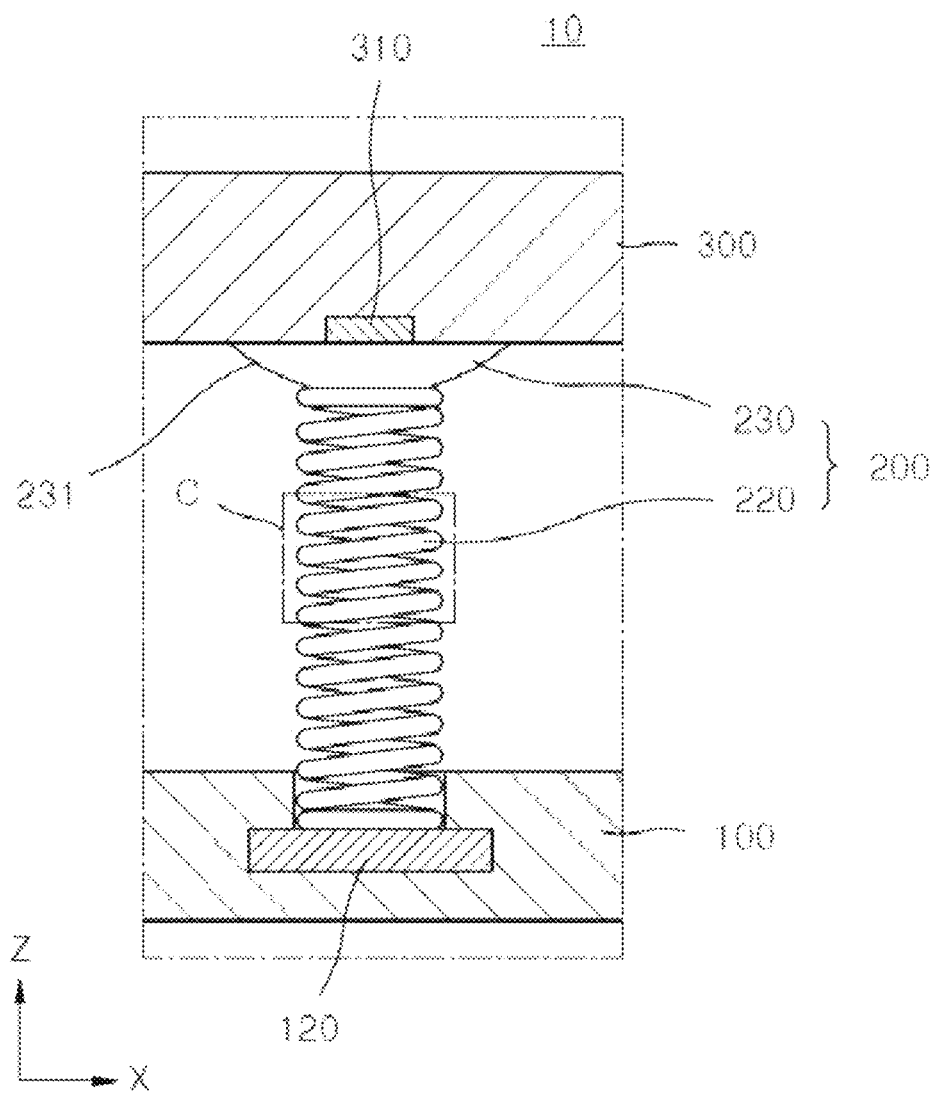
FIGS. 17A to 17G are cross-sectional diagrams showing a portion of a stretchable electronic device according to yet another embodiments of the present disclosure.
Figure 17B:
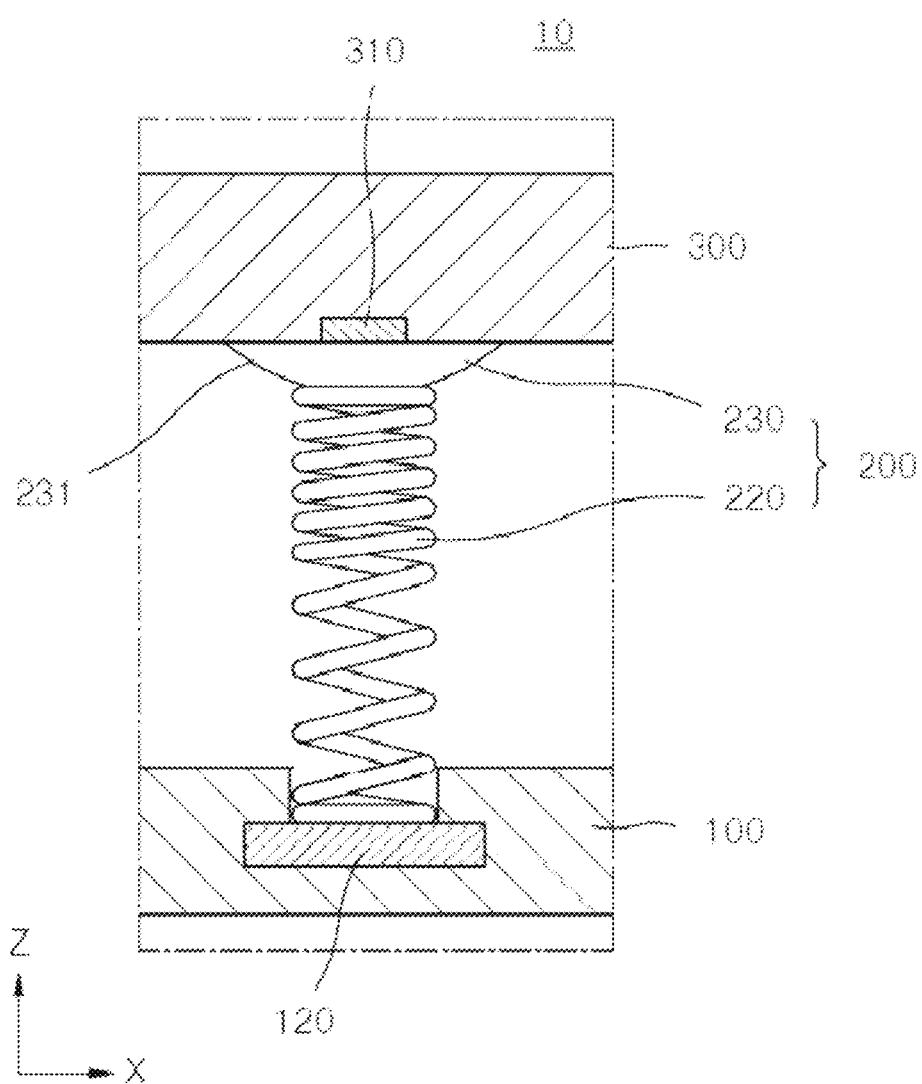
Figure 17C:
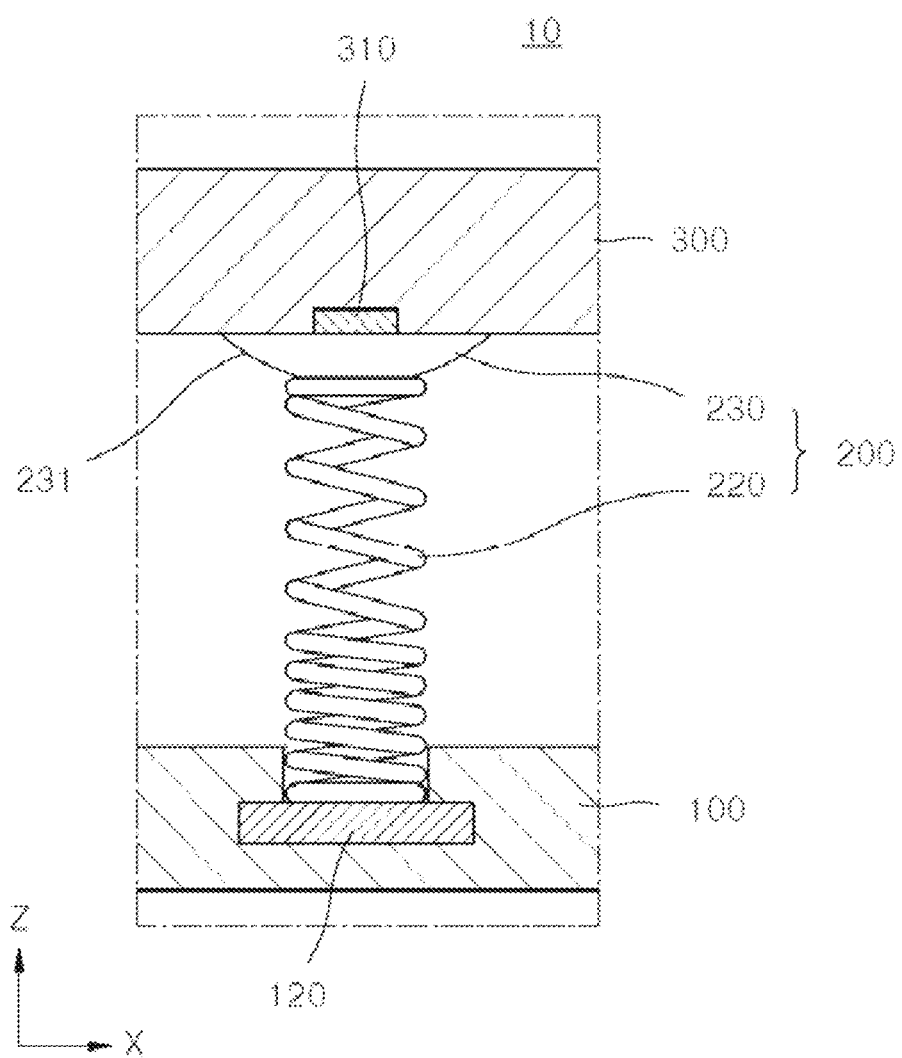
Figure 17D:
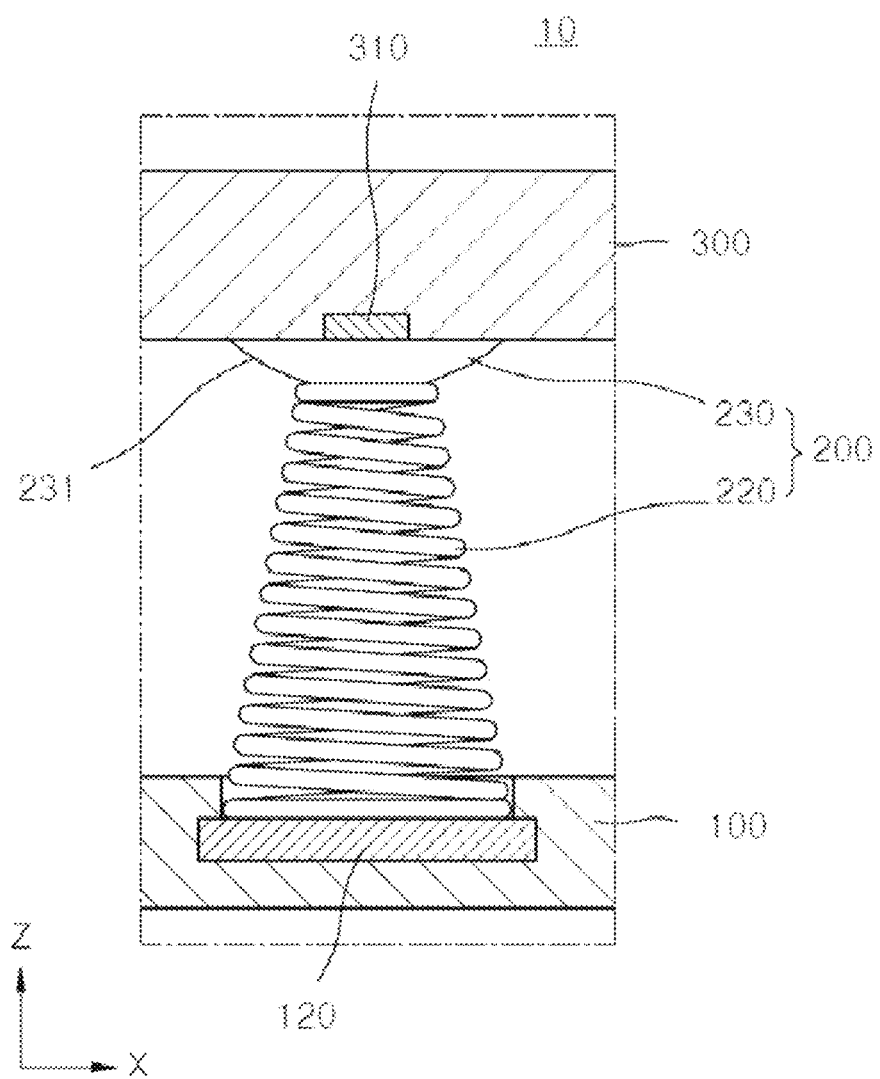
Figure 17E:
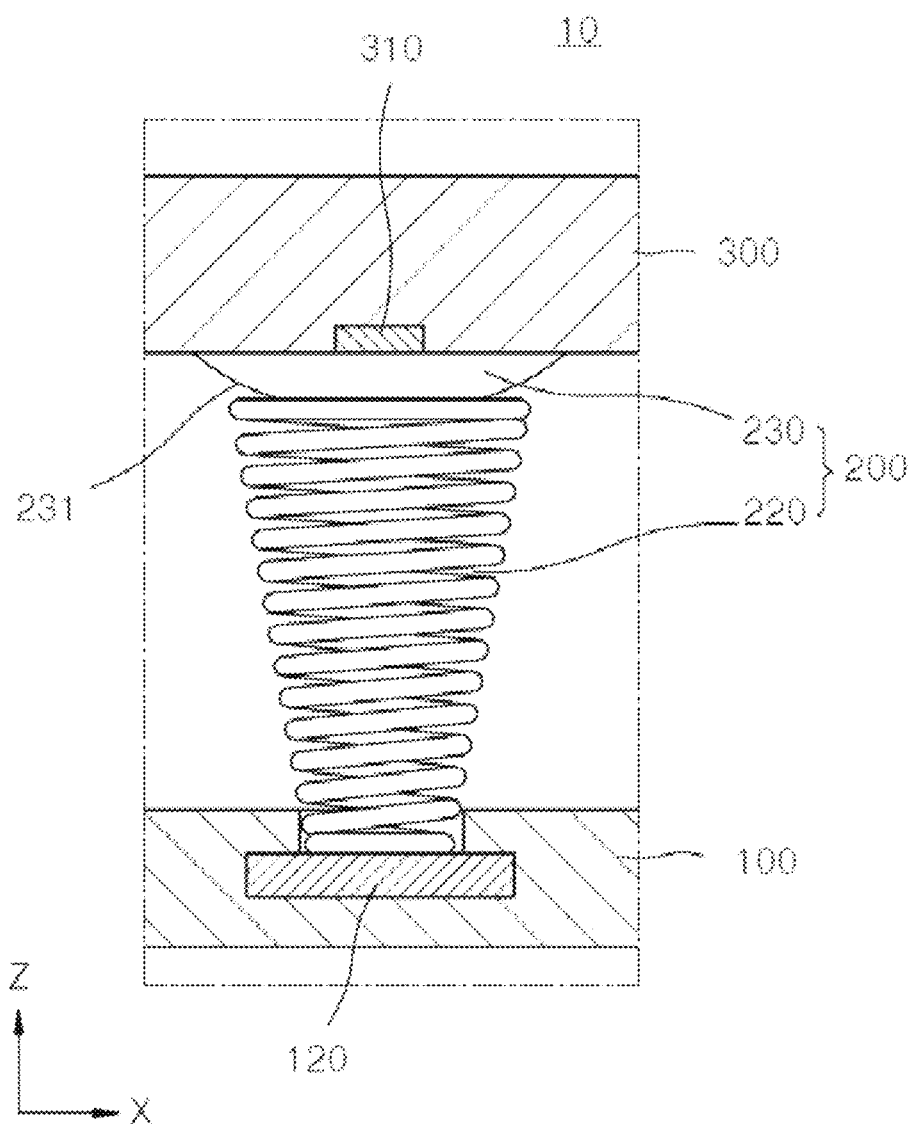
Figure 17F:
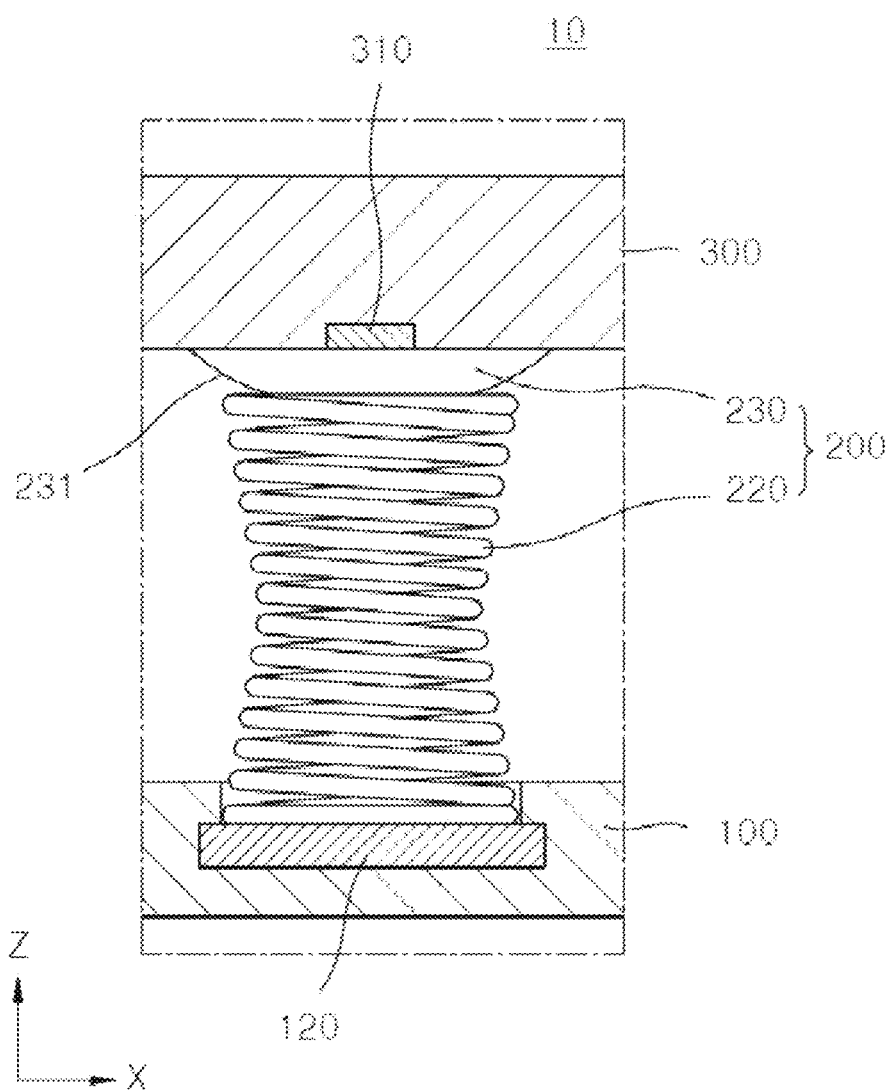
Figure 17G:
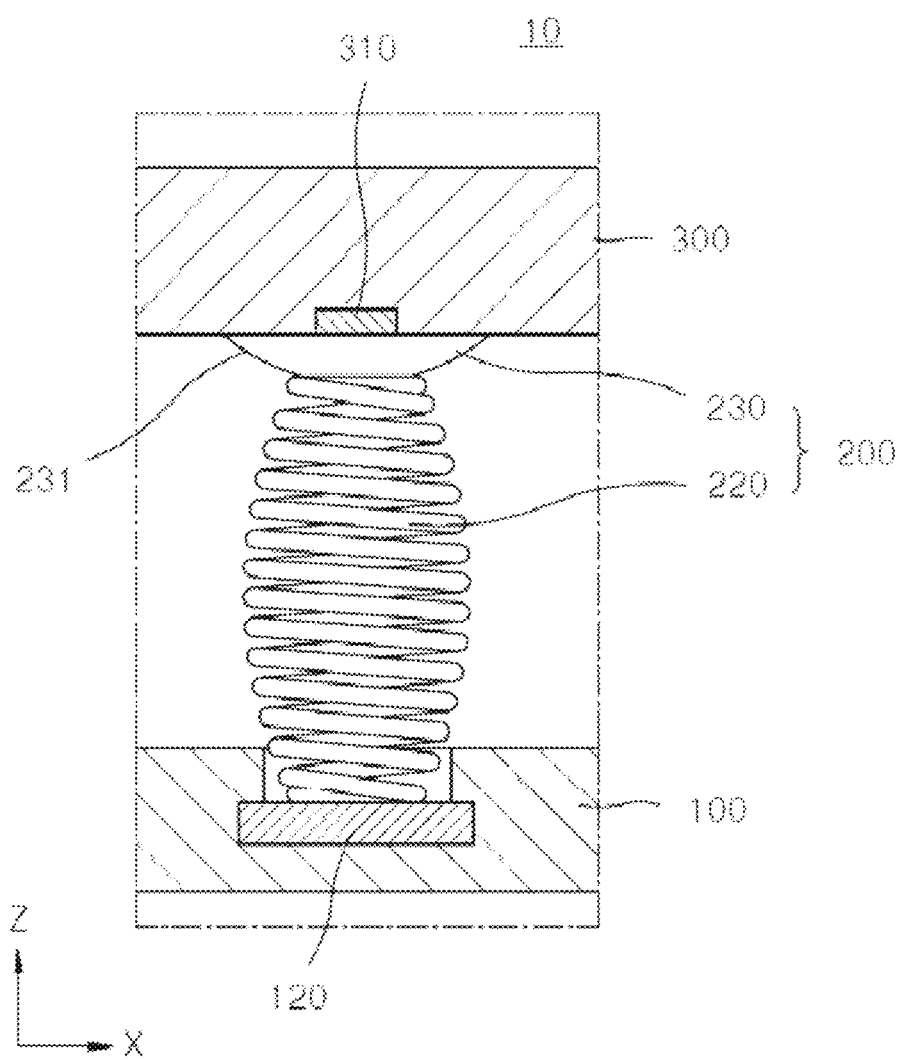
Figure 17H:
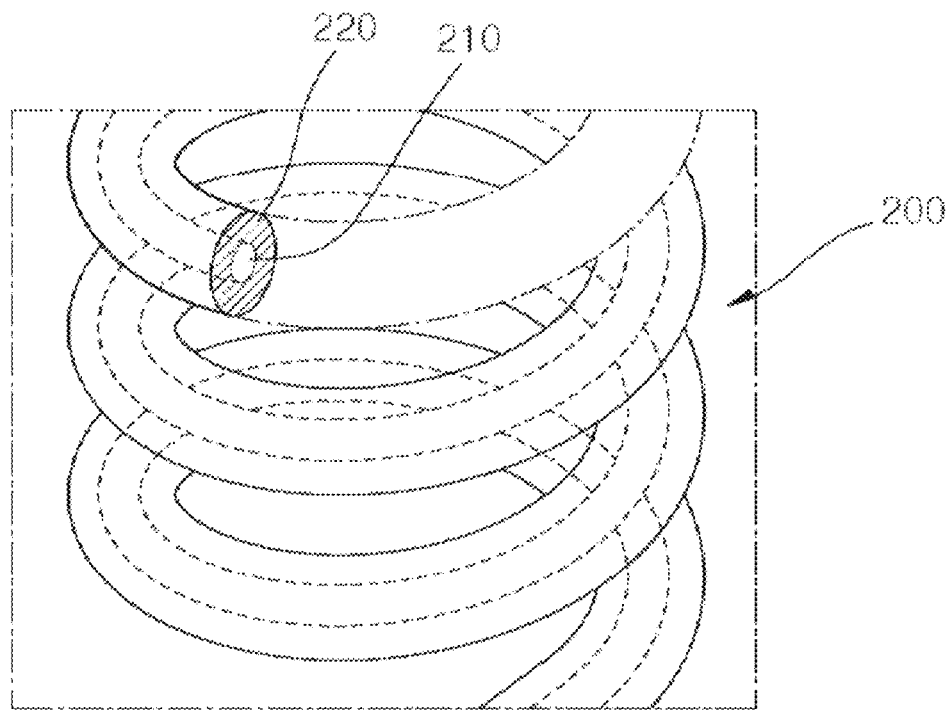
FIG. 17H is a partially cut perspective diagram showing the enlarged portion 'C' in FIG. 17A.

FIGS. 17A to 17G are cross-sectional diagrams showing a portion of a stretchable electronic device according to yet another embodiments of the present disclosure. FIG. 17H is a partially cut perspective diagram showing the enlarged portion 'C' in FIG. 17A.

The embodiments shown in FIGS. 17A to 17H differ from the above-described embodiments in that the conductive channel 210 and the stretchable member 220 of the stretchable conductive connecting body 200 have a spring structure.

The conductive connecting part 230 may be provided on the upper end portion of the conductive channel 210 of the spring structure. The conductive connecting part 230 may be provided with the material and structure having a high electrical contact force with the electrode 310 of the electric part 300. The conductive connecting part 230 may be provided in the structures and the conductive adhesive materials of the conductive suction plate 231 which have stretchable silicon-based epoxy, etc., the suction cup 232, and the suction cavity 236 or the composite material and structure thereof.

When the conductive channel 210 and the stretchable member 220 are designed to have a spring structure, it is possible to prevent the stretchable conductive connecting body 200 from being disconnected, and to reduce the change in the electrical characteristics by minimizing the change in the entire length of the conductive channel 210, even if the column strain greatly acts on the stretchable conductive connecting body 200.

FIGS. 18A to 18D are diagrams showing the stretchable conductive connecting body constituting the stretchable electronic device according to yet another embodiments of the present disclosure. The embodiments shown in FIGS. 18A to 18D show that the conductive channel 210 and the stretchable member 220 of the stretchable conductive connecting body 200 have a spring structure, and simultaneously, the stretchable conductive connecting body 200 has the three-dimensional fractal structure.

Figure 18A:
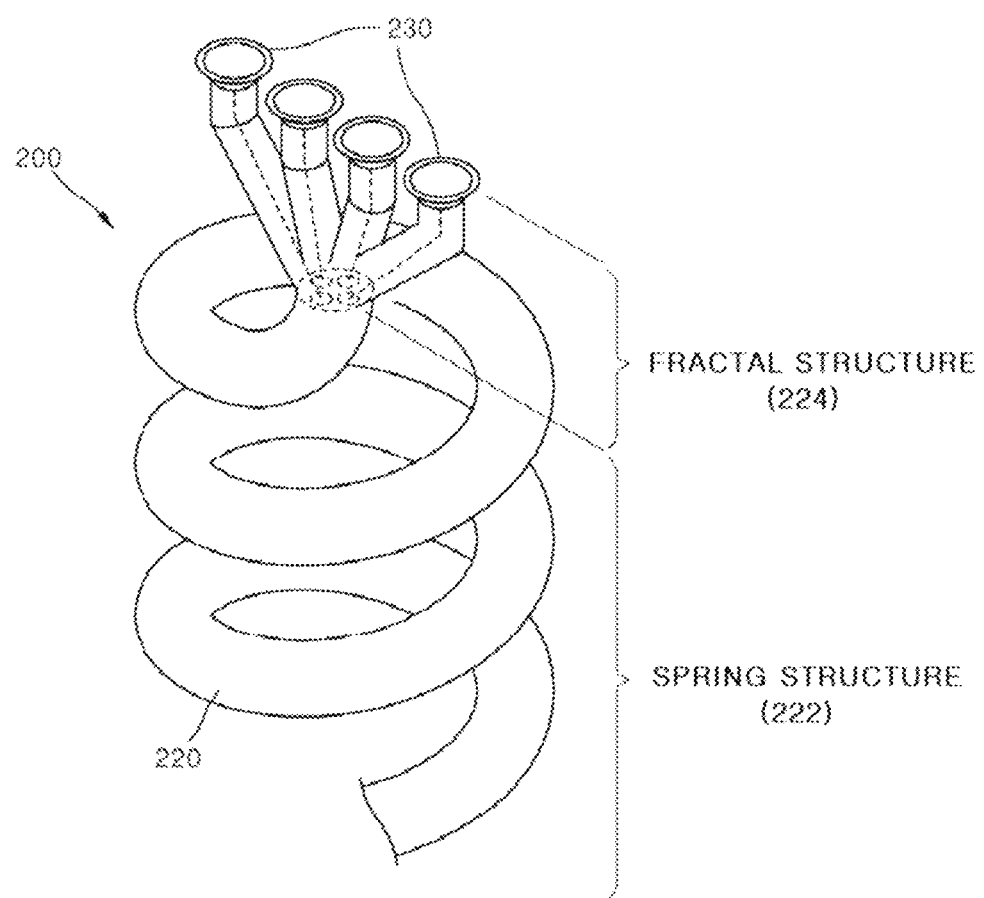
FIGS. 18A to 18D are perspective diagrams showing a stretchable conductive connecting body constituting the stretchable electronic device according to yet another embodiments of the present disclosure.

The stretchable conductive connecting body 200 shown in FIG. 18A is configured so that the portion of the lower shell 222 has the spring structure, and the upper portion of the spring structure is provided as the three-dimensional spring/fractal composite structure having the three-dimensional fractal structure branched into the plurality of branch shells 224.

Figure 18B:
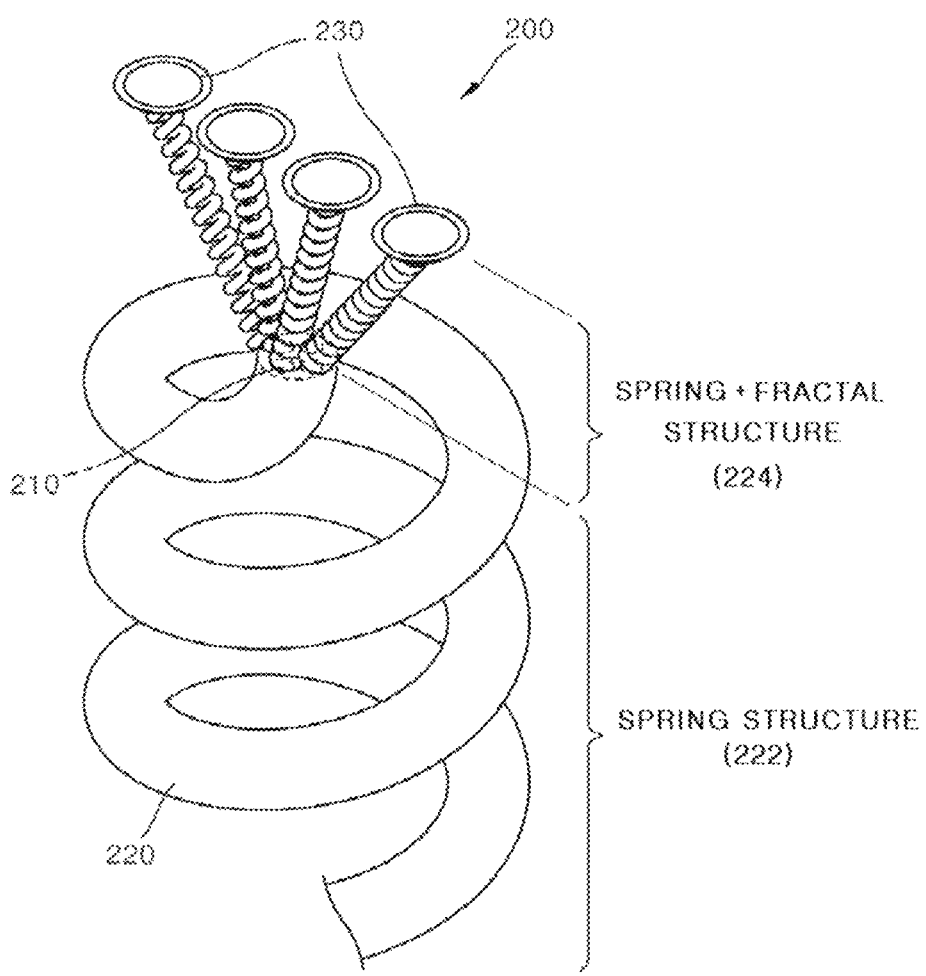

The stretchable conductive connecting body 200 shown in FIG. 18B is configured so that the portion of the lower shell 222 has the spring structure, the upper portion of the spring structure has the three-dimensional fractal structure, and the portion of the branch shell 224 is also provided as the three-dimensional spring/fractal composite structure having the spring structure.

Figure 18C:
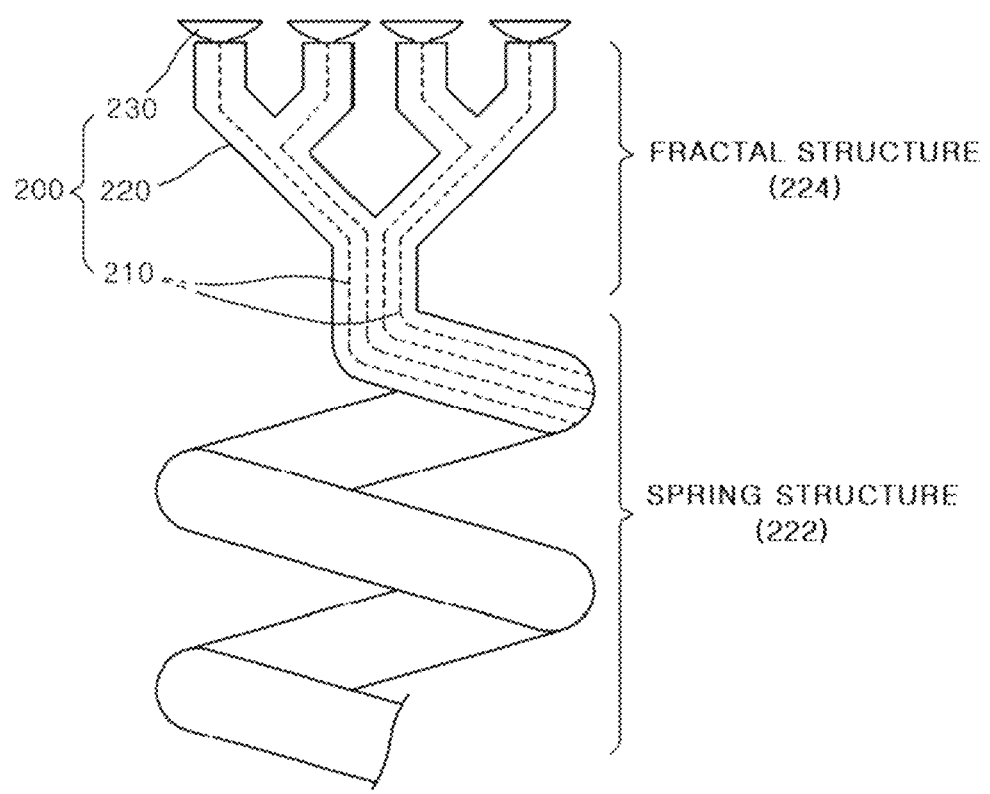
Figure 18D:
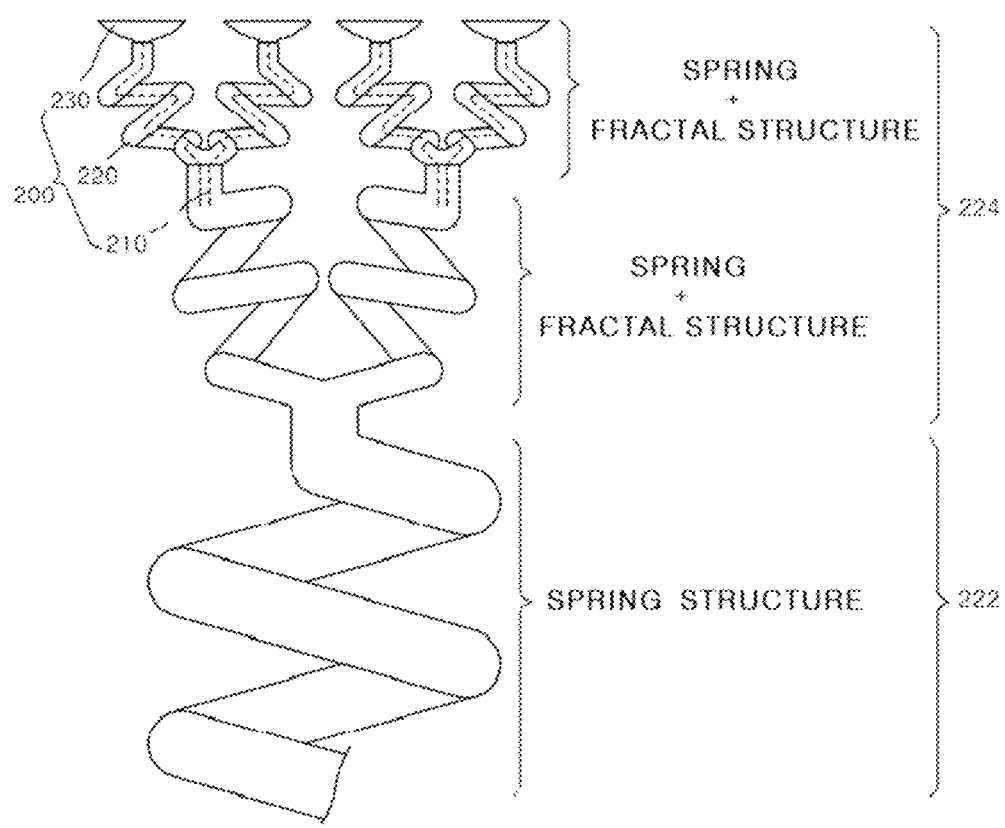

As shown in FIGS. 18C and 18D, the three-dimensional spring/fractal composite structure may also be applied to a multi-stage fractal structure of two stages or more in which the connection of the plurality of (multi-channel) stretchable conductive connecting bodies 200 are possible.

According to an embodiment of the stretchable electronic device having the stretchable conductive connecting body 200 of the three-dimensional spring/fractal composite structure as shown in FIGS. 18A to 18D, the stretchable conductive connecting body may variously increase to 6, 8, 10, 16 or more according to the number of electrodes of the electric part, and simultaneously, the structure thereof may also be changed into the spring/multi-stage fractal composite structure.

It is possible to simultaneously obtain the advantages of the spring structure and the three-dimensional fractal structure described above. Therefore, it is possible to minimize the stress/strain transferred to the electric part 300, and to prevent deterioration of the performance of the electric part 300, even if the electric part 300 requiring a large number of wirings is mounted on the stretchable conductive connecting body 200. In addition, the electric parts 300 may also be connected without electrical degradation phenomenon of the conductive channel within the stretchable electronic device 10.

Figure 19:
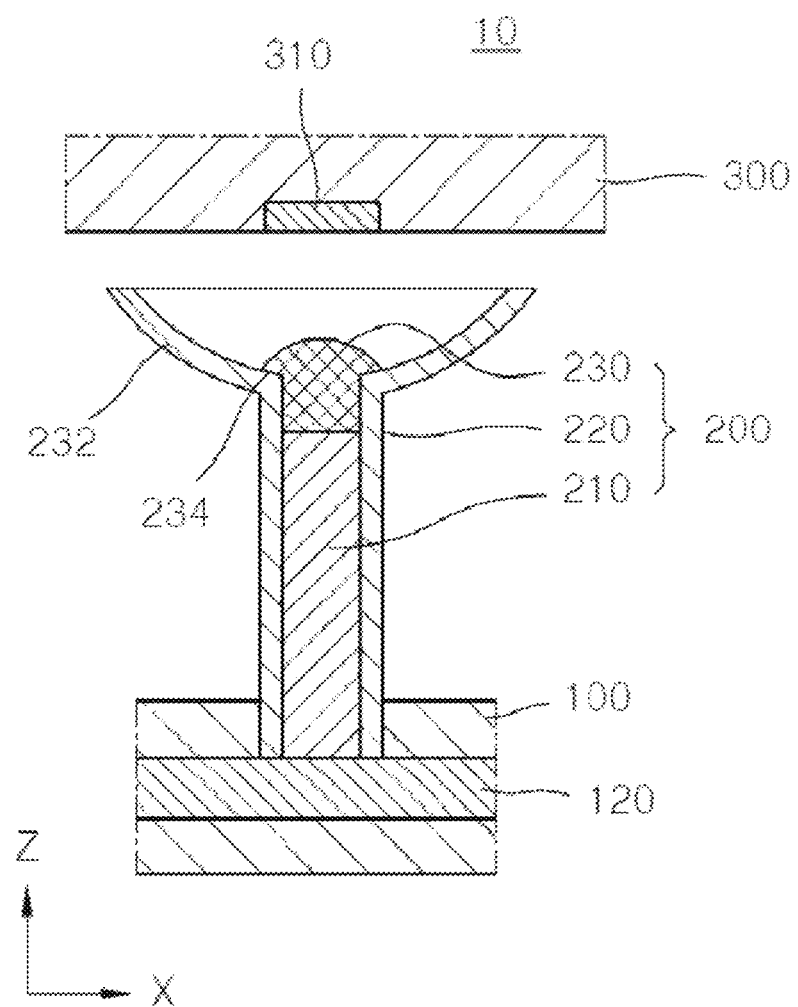
FIG. 19 is a cross-sectional diagram showing a portion of a stretchable electronic device according to still yet another embodiment of the present disclosure.

FIG. 19 is a cross-sectional diagram showing a portion of a stretchable electronic device according to still yet another embodiment of the present disclosure. Referring to FIG. 19, the conductive channel 210 may be made of nanowire such as metal, Carbon Nano Tube (CNT), graphene, liquid metal (e.g., EGaIn), conductive stretchable polymer, Ionic Conductor or a compound thereof. In an embodiment, the conductive liquid metal may contain a Eutectic Gallium-Indium (EGaIn) material.

In an embodiment in FIG. 19, the stretchable conductive connecting body 200 may include the conductive connecting part 230 prepared between the conductive channel 210 and the electrode 310 of the electric part 300.

The lower portion of the conductive connecting part 230 is inserted into the central portion hole of the stretchable member 220. The upper portion of the conductive connecting part 230 has a step 234 radially protruded outwards from the lower portion thereof in order to increase the electrical connection performance with the electrode 310 of the electric part 300 while increasing the bonding force with the suction cup 232. In an embodiment in FIG. 19, the upper surface portion of the conductive connecting part 230 may be formed in a convex curved shape, but may be deformed in various shapes such as a plane surface, a concave curved surface, an Elliptical surface, and a rectangular surface in order to enhance the bonding performance of the electrical connection with the electrode 310 of the electric part 300.

According to an embodiment in FIG. 19, it may be configured in the form in which modulus of elasticity gradually changes (e.g., a change in modulus of elasticity in the order of liquid metal, conductive stretchable polymer, Ionic Conductor, elastomer) in the order of the conductive channel 120 of the stretchable board 100, the conductive material of the conductive channel 210, the conductive connecting part 230, and the electrode 310 of the electric part 300, thereby maximizing the electrical bonding performance between the stretchable/flexible stretchable board 100 and the stretchable conductive connecting body 200 and the rigid electric part 300 even under various columns strains and compressive strains/the stresses of the stretchable electronic device 10.

The conductive liquid metal (e.g., EGaIn), which is the material of the conductive channel 210 of the stretchable conductive connecting body 200, may keep the good contact state with the conductive connecting part 230. In addition, the conductive connecting part 230 not only has the excellent wettability with the conductive liquid metal, but also has the high attaching force with the rigid electrode 310 of the electric part 300. The wettability with the conductive connecting part 230 is not limited only to the conductive liquid metal but has the high wettability even with respect to various conductive materials of the conductive channel 210.

In addition, the conductive connecting part 230 may keep the good contact state between the electrode 310 of the electric part 300 and various conductive materials (nanowire such as metal, Carbon Nano Tube (CNT), graphene, liquid metal (e.g., EGaIn), conductive stretchable polymer, Ionic Conductor, or a compound thereof) of the conductive channel 210 even if it is deformed by the elastic force when the stress/strain occurs in the stretchable conductive connecting body 200.

In addition, the materials of the conductive connecting part 230 and the conductive channel 210 may further increase the bonding force between the stretchable conductive connecting body 200 and the electrode 310 of the electric part 300 by a change in the elastic force (well stretched even under the low stress due to a reduction in modulus of elasticity) when being mixed with an ecoflex material (aliphatic/aromatic copolyesters). When the conductive connecting part 230 contains the ecoflex material of 8 wt % or less, the good conductivity may also be kept.

When the stretchable conductive connecting body 200 is attached to the electric part 300 by the conductive connecting part 230, the conductive connecting part 230 may be pressed and conductively adhered to the electrode 310 of the electric part 300, thereby securing the good electrical connection state.

Figure 20A:
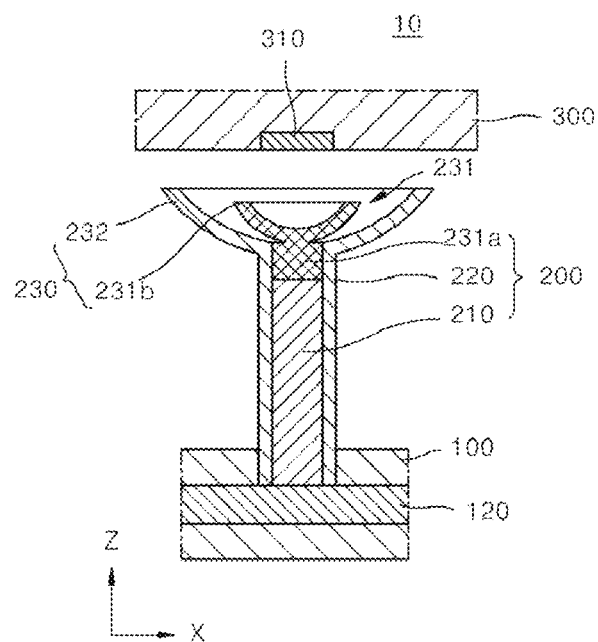
FIG. 20A is a cross-sectional diagram showing a portion of a stretchable electronic device according to another further embodiment of the present disclosure.
Figure 20B:
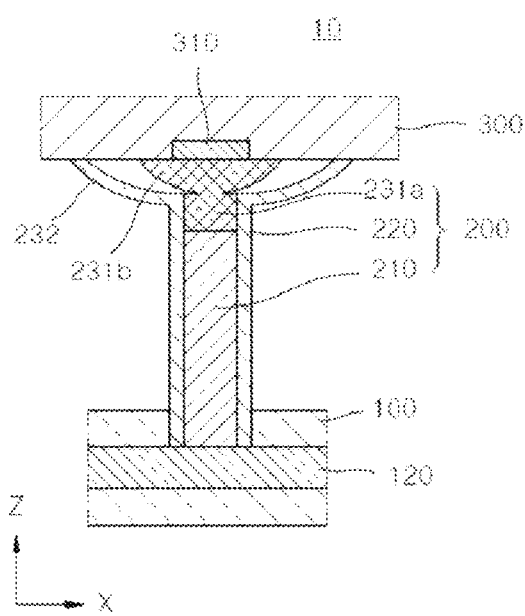
FIG. 20B is a cross-sectional diagram showing a state where the electric part has been attached to the stretchable conductive connecting body constituting the stretchable electronic device according to an embodiment in FIG. 20A.

FIG. 20A is a cross-sectional diagram showing a portion of a stretchable electronic device according to another further embodiment of the present disclosure. FIG. 20B is a cross-sectional diagram showing a state where an electric part has been attached to a stretchable conductive connecting body constituting the stretchable electronic device according to an embodiment in FIG. 20A.

According to an embodiment of FIGS. 20A and 20B, the conductive connecting part 230 for attaching the stretchable conductive connecting body 200 to the electric part 300 has a double sucker including both the conductive suction plate 231 corresponding to an embodiment in FIG. 3A and the suction cup 232 corresponding to an embodiment in FIG. 4A.

According to an embodiment in FIGS. 20A and 20B, it is possible to keep the good electrical contact state between the conductive channel 210 and the electrode 310 of the electric part 300 by the conductive suction plate 231, and simultaneously, to keep the bonding state between the stretchable conductive connecting body 200 and the electric part 300 more stably by closely contacting the stretchable conductive connecting body 200 with the surface of the electric part 300 by the suction cup 232.

Figure 21A:
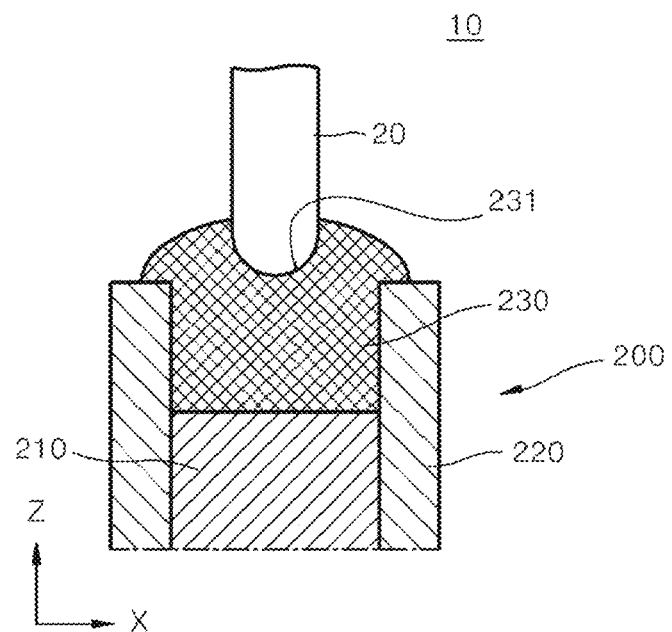
FIGS. 21A and 21B are diagrams for explaining a method for forming a suction cavity on the conductive connecting part constituting the stretchable electronic device according to an embodiment of the present disclosure.
Figure 21B:
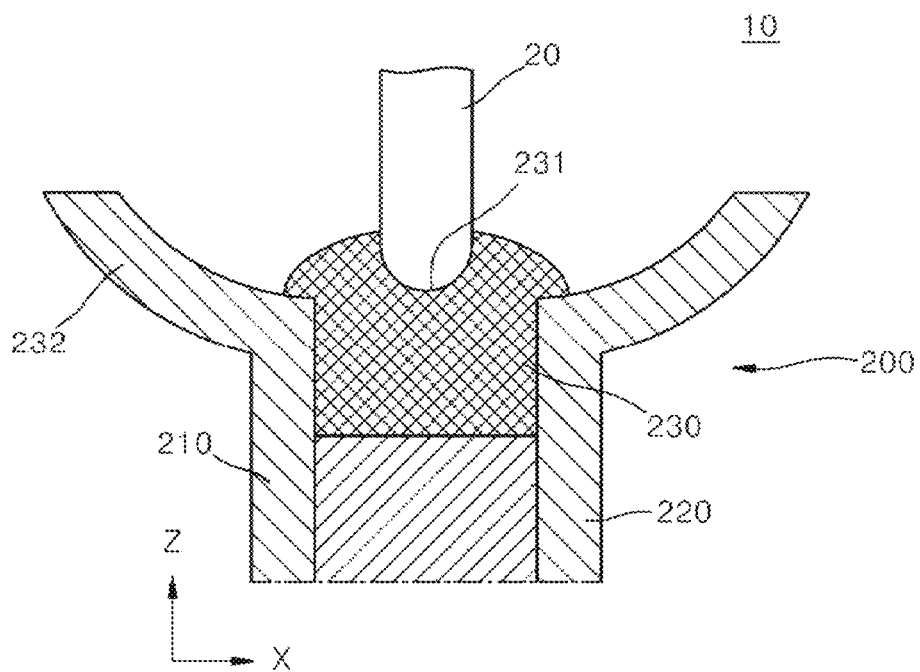

FIGS. 21A and 21B are diagrams for explaining a method for forming the conductive suction plate 231 having a shape different from that in FIG. 3C on the conductive connecting part 230 constituting the stretchable electronic device according to an embodiment of the present disclosure. In this embodiment, it is possible to couple the conductive connecting part 230 to the upper end portion of the stretchable member 220 filled with the conductive liquid metal, and then to contact the nano/micro-sized heating tip 20 heated at a high temperature of 150° C. or higher with the upper surface of the conductive connecting part 230 to cure it while forming the cavity, thereby forming the sucker such as the conductive suction cavity on the conductive connecting part 230. The shape and size of the cavity may be adjusted according to the shape and size of the heating tip 20.

In addition, as shown in FIG. 21B, it is possible to manufacture the stretchable conductive connecting body 200 by forming the double structure of the conductive suction plate 231 and the suction cup 232, which have the different shapes manufactured in FIG. 21A, on the conductive connecting part 230, thereby further enhancing the bonding force with the electric part 300.

Figure 22:
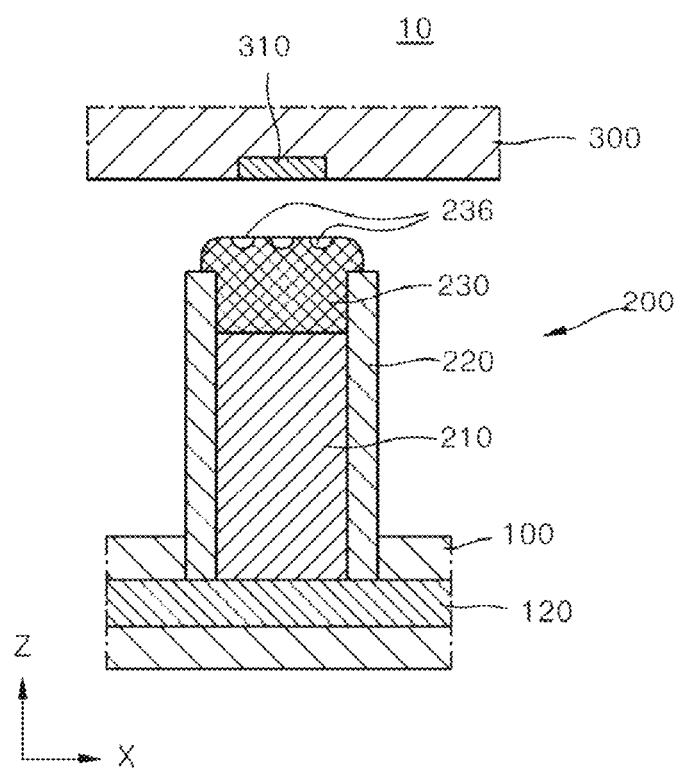
FIG. 22 is a cross-sectional diagram showing a portion of a stretchable electronic device according to another further embodiment of the present disclosure.

FIG. 22 is a cross-sectional diagram showing a portion of a stretchable electronic device according to another further embodiment of the present disclosure. An embodiment in FIG. 22 differs from the above-described embodiments in that the nano/micro-sized minute suction cavity 236 are incorporated and formed on the upper surface of the conductive connecting part 230 for attaching the stretchable conductive connecting body 200 to the electric part 300.

The nano or micro-sized minute suction cavities 236 may be formed on the upper surface of the conductive connecting part 230 to be bonded to the electric part 300, thereby obtaining the high electrical bonding characteristics without being influenced by the surface roughness of the bonded electrode 310 of the electric part 300.

FIGS. 23 to 26 are diagrams for explaining a method for forming the nano/micro-sized suction cavity in the conductive connecting part constituting the stretchable electronic device according to an embodiment in FIG. 22.

Figure 23:
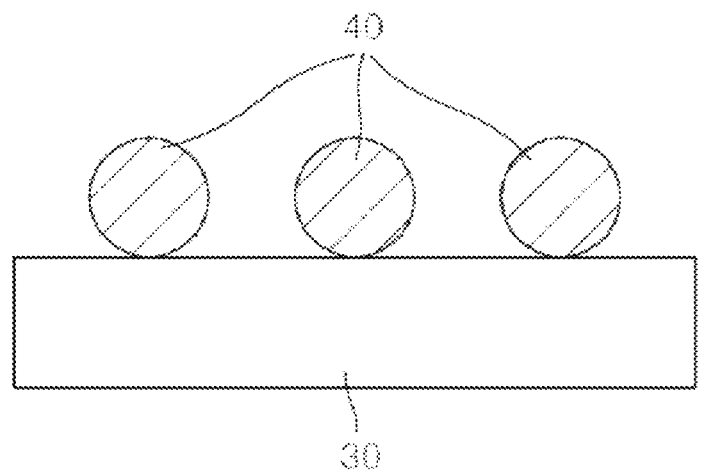
FIGS. 23 to 26 are diagrams for explaining a method for forming a suction cavity on the conductive connecting body constituting the stretchable electronic device according to an embodiment in FIG. 22.
Figure 24:
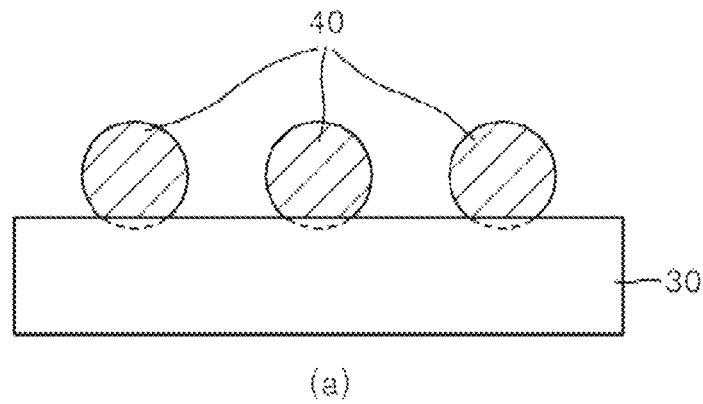
Figure 24:
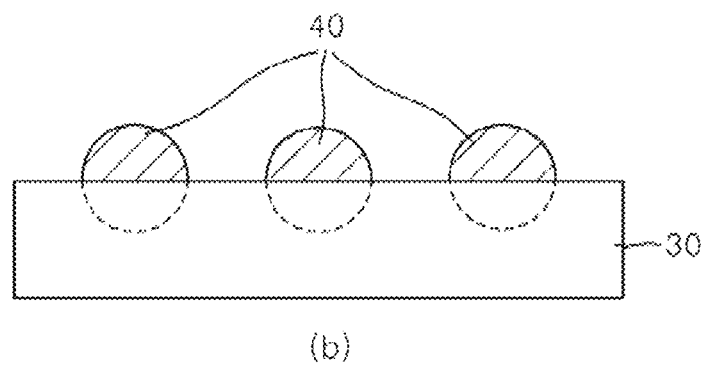
Figure 24:
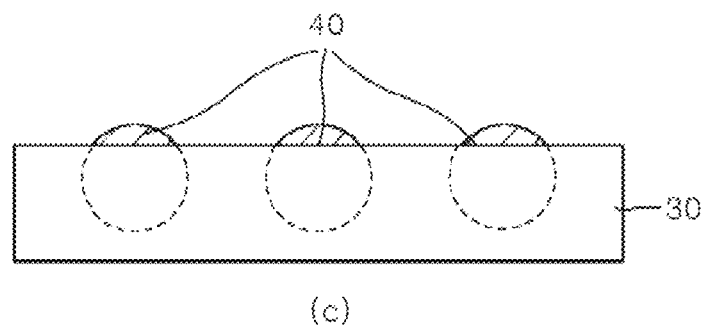

Firstly, referring to FIGS. 23 and 24, it is possible to spray nano or micro-sized polystyrene beads 40, which is a material susceptible to thermal strain, on a glass board 30 at regular intervals by a method such as a spin coating and then to heat the polystyrene beads 40 at the Vicat softening temperature (84 to 105☐), thereby deforming it on the glass board 30. The deformed form of the polystyrene beads 40 may be adjusted as shown in FIGS. 24A, 24B, and 24C according to a heating time, a heating temperature, etc., thereby manufacturing various forms of the minute suction cavities 236.

Figure 25:
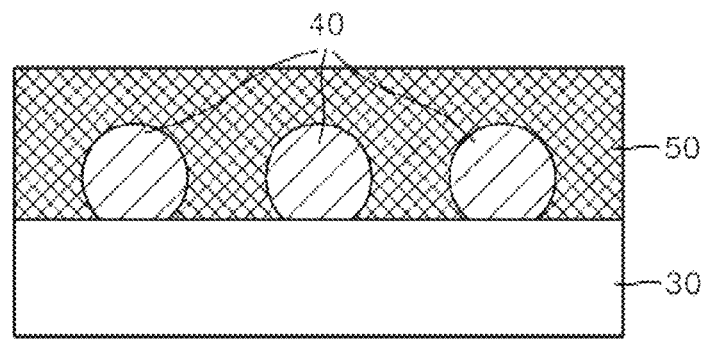
Figure 25:
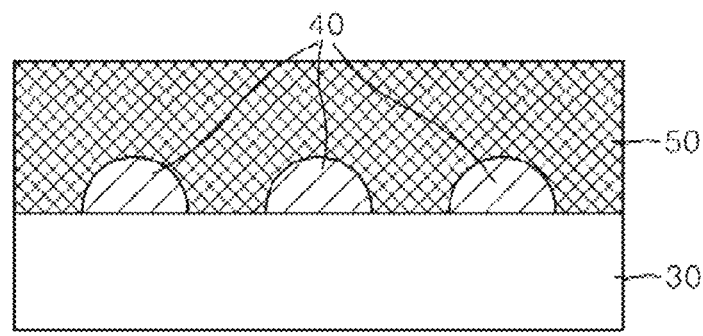
Figure 25:
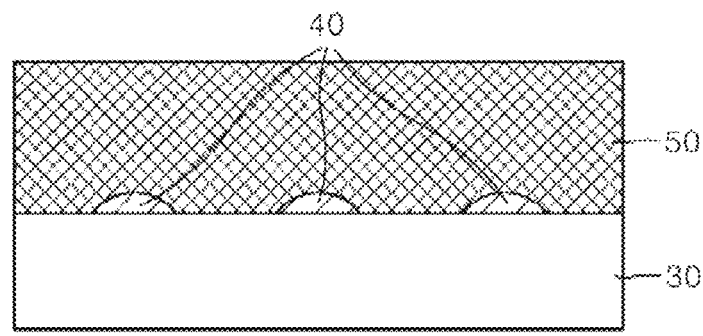

Thereafter, as shown in FIG. 25, it is possible to form the conductive polymer material 50 on the glass board 30 so as to cover the deformed polystyrene beads 40, and then to remove the polystyrene beads 40 by acetone, etc. The conductive polymer material 50 may be the same material as a material of the conductive connecting part 230 or the conductive channel 210.

Figure 26:
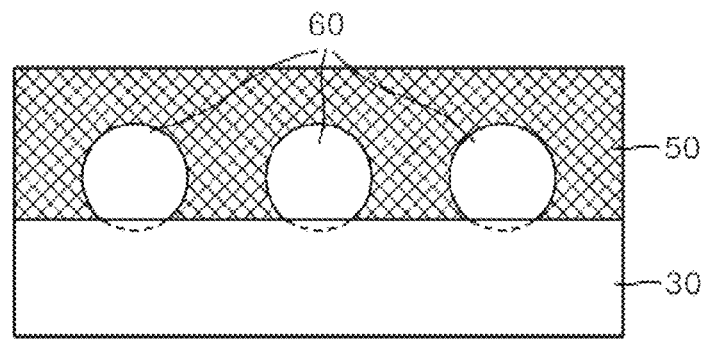
Figure 26:
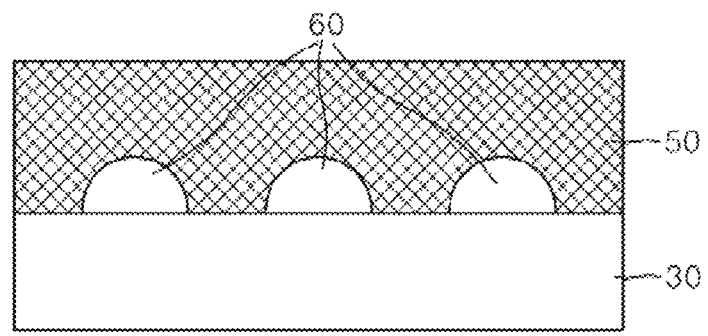
Figure 26:
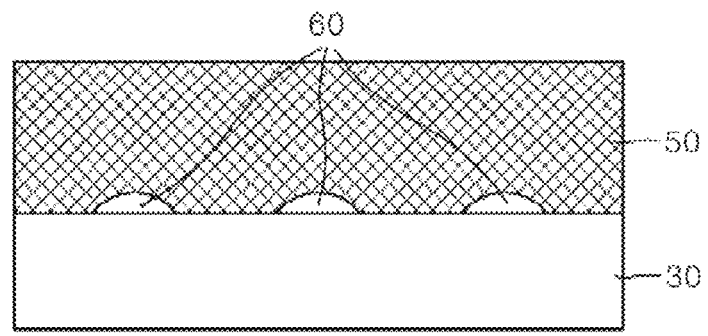

When the polystyrene beads 40 are removed, as shown in FIG. 26, suction cavities 60, 236 similar to the octopus sucker form may be formed in the conductive polymer material 50. When the diameter of the polystyrene beads 40, the Vicat softening temperature, the applied amount (applied density), the heating time, etc. are controlled, as shown in FIGS. 26A, 26B, and 26C, the size, shape, and density of the suction cavities 60, 236 of the conductive polymer material 50 may be variously adjusted.

Figure 27:
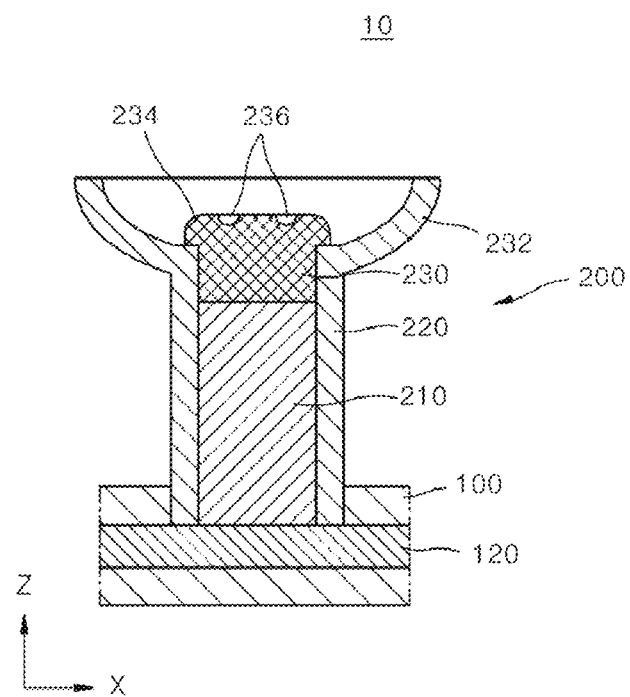
FIG. 27 is a cross-sectional diagram showing a portion of a stretchable electronic device according to still another further embodiment of the present disclosure.
Figure 28:
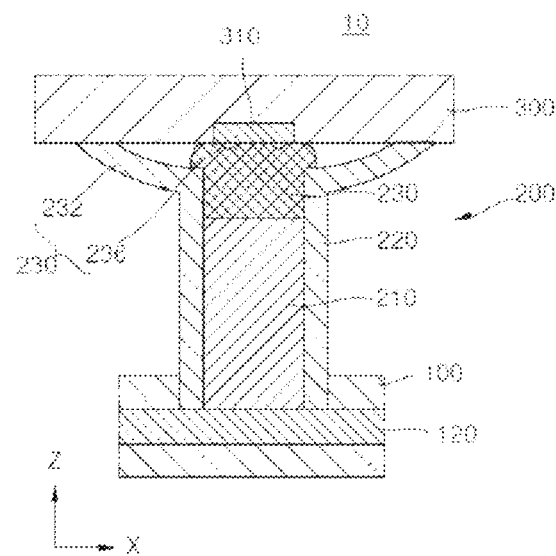
FIG. 28 is a diagram showing a state where an electric part has been bonded to a stretchable conductive connecting body constituting the stretchable electronic device according to an embodiment in FIG. 27.

FIG. 27 is a cross-sectional diagram showing a portion of a stretchable electronic device according to still another further embodiment of the present disclosure. FIG. 28 is a diagram showing a state where an electric part has been bonded to a stretchable conductive connecting body constituting the stretchable electronic device according to an embodiment in FIG. 27.

An embodiment of FIGS. 27 and 28 has a double sucker in which the conductive connecting part 230 includes both the suction cup 232 formed in the stretchable member 220 (or conductive suction plate) and the minute suction cavity 236. According to an embodiment in FIGS. 27 and 28, it is possible to further improve the bonding force between the stretchable conductive connecting body 200 and the electric part 300 by the double sucker of the suction cup 232 and the suction cavity 236.

Figure 29:
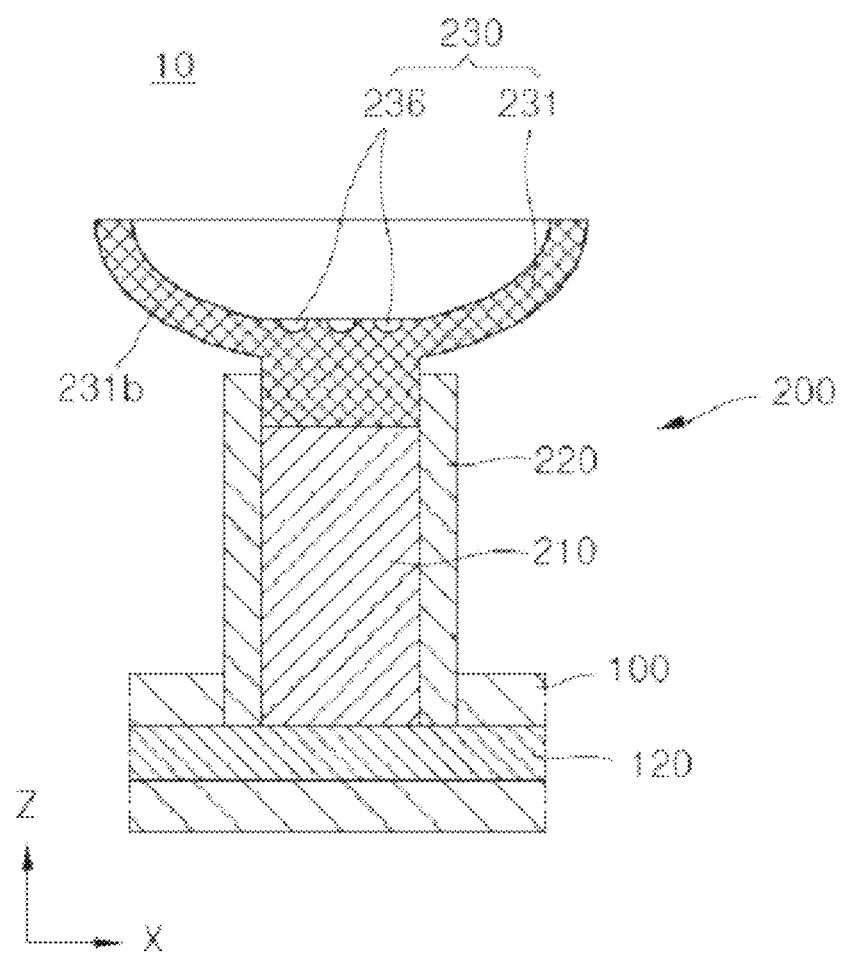
FIG. 29 is a cross-sectional diagram showing a portion of a stretchable electronic device according to yet another further embodiment of the present disclosure.

FIG. 29 is a cross-sectional diagram showing a portion of a stretchable electronic device according to yet another further embodiment of the present disclosure. In an embodiment in FIG. 29, the conductive connecting part 230 has the double sucker including both the suction plate 231b of the conductive suction plate 231 included in an embodiment in FIG. 3A and the suction cavity 236 formed on the upper surface of the conductive suction plate 231. According to an embodiment in FIG. 29, it is possible to further enhance the bonding force between the stretchable conductive connecting body 200 and the electric part having the surface roughness by the double sucker of the suction plate 231b of the conductive suction plate 231 and the suction cavity 236.

Figure 30:
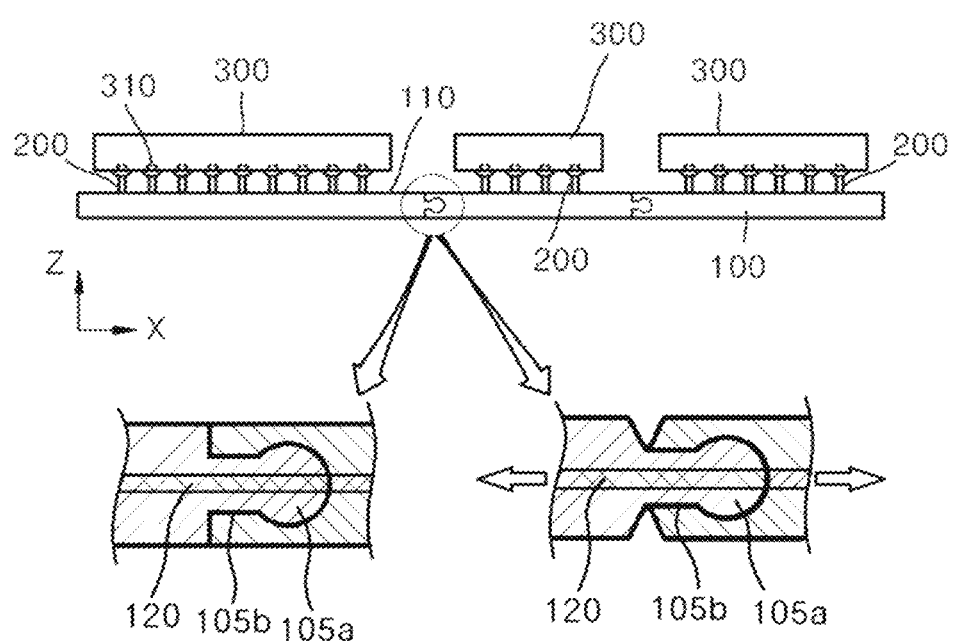
FIG. 30 is a cross-sectional diagram and a partial operating diagram showing the coupled figure for each module of the stretchable board 100 of the stretchable electronic device according to yet another further embodiment of the present disclosure.

FIG. 30 is a cross-sectional diagram and a partial operating diagram showing the coupled figure for each module of the stretchable board 100 of the stretchable electronic device according to yet another further embodiment of the present disclosure.

An embodiment in FIG. 30 may be provided with the stretchable board 100 in plural for each module every the electric part 300 so as to have the surface 110 for mounting at least one electric part 300. That is, the embodiments shown in the previous drawings of FIG. 30 are provided with a plurality of conductive connecting bodies 200 so as to facilitate the stretchable connection of the plurality of electric parts 300 to one stretchable board 100.

However, an embodiment in FIG. 30 has the surface 110 for mounting one or more electric parts 300 for each stretchable board 100, and in order to connect the plurality of electric parts 300, proposes a structure provided so that the plurality of stretchable boards 100 are connected to each other for each module to connect the first conductive channels 120 included therein to each other.

For the mutual stretchable connection between the plurality of electric parts 300, as shown in FIG. 30, the stretchable board 100 may have a connecting body inserting part 105a inserted into one side end portion of the stretchable board 100 adjacent to one side thereof, and a connecting body recessed groove part 105b for inserting the connecting body inserting part 105a of the stretchable board 100 adjacent to the other side thereof, respectively.

Herein, even if the tensile force is applied to the stretchable board 100 mutually connected for each module, as shown in FIG. 30, the connecting portion between the connecting body inserting part 105a and the connecting body recessed groove part 105b does not move, and only the adjacent portion of the stretchable board 100 is deformed in shape so that the first conductive channel 120 is continuously connected, thereby flexibly coping with not only the stress/strain applied to the electric part but also the external force applied to the wearable device itself.

The stretchable electronic device according to an embodiment of the present disclosure may significantly reduce the mechanical stress and strain of the tensile/compression/bending in various directions, which are received by the electric part 300, for example, the IC chip on the plane, through the three-dimensional stereoscopic structure. The stretchable electronic device according to an embodiment of the present disclosure may be applied to various fields requiring the conductive connection between the heterogeneous materials, as well as the wearable electronic device.

In the stretchable electronic device according to an embodiment of the present disclosure, it is possible to manufacture the stretchable board 100 and/or the stretchable conductive connecting body 200 by a 3D printer, to easily manufacture various shapes of the stretchable PCB of the 3D stereoscopic structure by the 3D printer, and to easily change the stretchable/flexible characteristics by selecting/changing the 3D printing material. According to an embodiment of the present disclosure, it is possible to reduce/alleviate the strain increasing rate of the stretchable conductive connecting body 200 through the 3D stereoscopic structure, and to minimize the stress/strain transferred to the electric part 300 caused by the above.

The stretchable electronic device according to an embodiment of the present disclosure may be designed as the spring structure, the three-dimensional fractal structure, or the three-dimensional spring/fractal composite structure for a large number of stress/strain-minimized electrical connections.

When the stretchable conductive connecting body 200 is designed as the micro electrode channel of the spring structure, the stretchable electronic device according to an embodiment of the present disclosure may be not only easily deformed, but also may hardly change in length of the final electrode even when deformed, thereby also minimizing the change in resistance.

The stretchable electronic device according to an embodiment of the present disclosure may be manufactured in the structure in which the multiple electrical connections to the multi leg of the IC chip by the three-dimensional fractal structure are possible, and applied to the PCB circuit requiring the plurality of electrical bonding/connections while minimizing the mechanical stress and strain.

The stretchable electronic device according to an embodiment of the present disclosure may simultaneously obtain the advantages of the spring structure and the three-dimensional fractal structure described above by the stretchable conductive connecting body 200 of the three-dimensional spring/fractal composite structure.

The stretchable electronic device according to an embodiment of the present disclosure may insert the conductive polymer between the rigid conductive material (electrode of the electric part) and the liquid material (conductive channel), thereby maximizing the bonding force between the rigid material and the flexible material while minimizing the stress and strain through the gradual change of modulus of elasticity (e.g., the change in modulus of elasticity in the order of liquid metal, conductive stretchable polymer, Ionic Conductor, and elastomer).

The stretchable electronic device according to an embodiment of the present disclosure may repeatedly detach and attach the electric part 300 through the sucker and easily replace and upgrade the IC chip, etc. because it does not need an adhesive agent when detaching and attaching the electric part 300. When the detachment and attachment of the electric part is not required, it is possible to perform the electrical connection and the mechanical bonding of the electric part by using the conductive adhesive agent. In addition, it is possible to maximize the bonding force between the stretchable board and the electric part by compositely using the sucker and the adhesive material.

The stretchable electronic device according to an embodiment of the present disclosure may arrange the high-performance electric parts having the plurality of wires on various 3D stereoscopic structures through the stretchable conductive connecting body 200 and the stretchable board 100, thereby keeping the good electrical connection without changing the conductivity even under various external strains as well as column/compressive strain, and being used in the high-performance stretchable/flexible wearable electronic device.

As described above, while the present disclosure has specifically explained the representative embodiments of the present disclosure, it is to be understood to those skilled in the art in which the present disclosure pertains that various modifications may be made with respect to the above-described embodiment without departing from the scope of the present disclosure. Therefore, the scope of the present disclosure should not be limited to the described embodiments, but should be determined by equivalents to the appended claims, as well as the following claims.

What is claimed is:

1. A method for manufacturing a stretchable electronic device, comprising:
   manufacturing and connecting a stretchable board and a stretchable conductive connecting body constituting the stretchable electronic device, the stretchable board having a surface for mounting an electric part, the stretchable conductive connecting body being provided on the stretchable board, extended in a three-dimensional stereoscopic structure in a direction away from the surface, and having stretchability, wherein the stretchable conductive connecting body comprises a conductive connecting part for attaching an upper surface of the stretchable conductive connecting body to the electric part so as to be electrically connected to an electrode of the electric part; and
   attaching the electric part to the stretchable conductive connecting body,
   wherein the manufacturing the stretchable conductive connecting body comprises:
      filling a stretchable conductive channel material comprising at least one among conductive nanowire, Carbon Nano Tube (CNT), graphene, liquid metal, conductive stretchable polymer, Ionic Conductor, or a compound thereof within a stretchable member coupled to the surface of the stretchable board; and
      manufacturing the conductive connecting part, and coupling the conductive connecting part to the upper surface of the stretchable conductive connecting body, and
   wherein the conductive connecting part comprises a conductive sucker or a conductive adhesive material for connecting the upper surface of the stretchable conductive connecting body to the electric part, or comprises a composite structure of the conductive sucker and the conductive adhesive material.

2. The method for manufacturing the stretchable electronic device of claim 1, wherein the manufacturing and connecting the stretchable conductive connecting body comprises manufacturing the stretchable conductive connecting body so as to have at least one among a spring structure, a three-dimensional fractal structure, and a three-dimensional spring and fractal composite structure.

3. The method for manufacturing the stretchable electronic device of claim 1, wherein the manufacturing the conductive connecting part further comprises manufacturing a conductive suction cavity,
   wherein the manufacturing the conductive suction cavity comprises manufacturing a cavity structure necessary for suction, and
   wherein the manufacturing the conductive suction cavity comprises:
      applying polystyrene beads on a glass board;
      deforming the polystyrene beads by heating the polystyrene beads on the glass board at a softening temperature;
      forming a stretchable and flexible conductive material so as to cover the polystyrene beads on the glass board; and
      forming the conductive suction cavity on the stretchable and flexible conductive material by removing the polystyrene beads.

4. A method for manufacturing a stretchable electronic device, comprising:
   manufacturing and connecting a stretchable board and a stretchable conductive connecting body constituting the stretchable electronic device, the stretchable board having a surface for mounting an electric part, the stretchable conductive connecting body being provided on the stretchable board, extended in a three-dimensional stereoscopic structure in a direction away from the surface, and having stretchability, wherein the stretchable conductive connecting body comprises a conductive connecting part for attaching an upper surface of the stretchable conductive connecting body to the electric part so as to be electrically connected to an electrode of the electric part; and
   attaching the electric part to the stretchable conductive connecting body,
   wherein the manufacturing and connecting the stretchable board and the stretchable conductive connecting body comprises manufacturing the stretchable board and the stretchable conductive connecting body by a 3D printer, and
   wherein the manufacturing the stretchable board comprises injecting a stretchable conductive channel material comprising at least one among conductive nanowire, Carbon Nano Tube (CNT), graphene, liquid metal, conductive stretchable polymer, Ionic Conductor, or a compound thereof within the stretchable board.

* * * * *